(12) United States Patent
Zhang et al.

(10) Patent No.: US 12,004,367 B2
(45) Date of Patent: Jun. 4, 2024

(54) DISPLAY SUBSTRATE, MANUFACTURING METHOD THEREOF, AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Xin Zhang, Beijing (CN); Yupeng He, Beijing (CN); Yang Zhou, Beijing (CN); Wei Wang, Beijing (CN); Xiaofeng Jiang, Beijing (CN); Yu Wang, Beijing (CN); Lulu Yang, Beijing (CN); Yiyang Zhang, Beijing (CN); Guanghui Yang, Beijing (CN); Jiaming Lu, Beijing (CN); Rui Hao, Beijing (CN); Qun Ma, Beijing (CN); Pu Liu, Beijing (CN); Liudong Zhu, Beijing (CN); Qiang Huang, Beijing (CN); Bin He, Beijing (CN); Dinan Duan, Beijing (CN); Haiyong Bai, Beijing (CN); Xin Li, Beijing (CN); Ruiqi Wei, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 591 days.

(21) Appl. No.: 17/271,490

(22) PCT Filed: Jun. 30, 2020

(86) PCT No.: PCT/CN2020/099169
§ 371 (c)(1),
(2) Date: Feb. 25, 2021

(87) PCT Pub. No.: WO2021/237867
PCT Pub. Date: Dec. 2, 2021

(65) Prior Publication Data
US 2022/0199943 A1    Jun. 23, 2022

(30) Foreign Application Priority Data

May 27, 2020 (CN) .......................... 202010463370.4

(51) Int. Cl.
*H01L 51/52* (2006.01)
*H01L 27/32* (2006.01)
(Continued)

(52) U.S. Cl.
CPC ......... *H10K 50/844* (2023.02); *H10K 59/122* (2023.02); *H10K 59/124* (2023.02);
(Continued)

(58) Field of Classification Search
CPC .. H10K 50/844; H10K 50/8445; H10K 50/80; H10K 59/122; H10K 59/124;
(Continued)

(56) References Cited

U.S. PATENT DOCUMENTS

| 10,230,069 B2 | 3/2019 | Choi et al. |
| 10,431,772 B2 | 10/2019 | Choi et al. |

(Continued)

FOREIGN PATENT DOCUMENTS

| CN | 105914224 A | 8/2016 |
| CN | 107085475 A | 8/2017 |

(Continued)

OTHER PUBLICATIONS

International Search Report dated Feb. 20, 2021, issued in counterpart Application No. PCT/CN2020/099169. (4 pages).

(Continued)

*Primary Examiner* — Nikolay K Yushin
(74) *Attorney, Agent, or Firm* — WHDA, LLP

(57) ABSTRACT

A display substrate, a manufacturing method thereof, and a display device are provided. The display substrate includes: a base substrate at least including a pixel area and a hole area; a plurality of sub-pixels arranged on the base substrate and located in the pixel area; a hole in the hole area; a first barrier dam arranged between the sub-pixels and the hole and at least partially surrounding the hole; an organic (Continued)

material layer including at least one film layer, wherein an orthographic projection of the organic material layer on the base substrate falls within the pixel area; and a filling structure, wherein at least a portion of the filling structure is arranged between the hole and the first barrier dam, and the filling structure and the at least one film layer of the organic material layer are located in the same layer and include the same material.

28 Claims, 25 Drawing Sheets

(51) Int. Cl.
    *H10K 50/844*     (2023.01)
    *H10K 59/122*     (2023.01)
    *H10K 59/124*     (2023.01)
    *H10K 71/00*     (2023.01)
    *H10K 59/12*     (2023.01)
    *H10K 77/10*     (2023.01)

(52) U.S. Cl.
    CPC ......... *H10K 71/00* (2023.02); *H10K 59/1201* (2023.02); *H10K 77/111* (2023.02)

(58) Field of Classification Search
    CPC .... H10K 59/1201; H10K 59/12; H10K 59/65; H10K 59/88; H10K 71/00; H10K 71/10; H10K 71/621; H10K 77/111; H10K 77/10; H10K 77/00
    See application file for complete search history.

(56) References Cited

U.S. PATENT DOCUMENTS

| | | | |
|---|---|---|---|
| 10,541,380 | B1 | 1/2020 | Sung et al. |
| 10,680,205 | B2 | 6/2020 | Choi et al. |
| 10,873,053 | B2 | 12/2020 | Sung et al. |
| 10,978,674 | B2 | 4/2021 | Choi et al. |
| 11,302,879 | B2 * | 4/2022 | Liu .................. H10K 77/111 |
| 2017/0237037 | A1 | 8/2017 | Choi et al. |
| 2019/0334120 | A1 | 10/2019 | Seo et al. |
| 2020/0127233 | A1 | 4/2020 | Sung et al. |
| 2020/0152842 | A1 | 5/2020 | Park et al. |
| 2020/0235194 | A1 | 7/2020 | Ito et al. |
| 2020/0243779 | A1 * | 7/2020 | Liu .................. H10K 71/00 |
| 2020/0280021 | A1 | 9/2020 | Li et al. |
| 2021/0111374 | A1 | 4/2021 | Sung et al. |

FOREIGN PATENT DOCUMENTS

| | | |
|---|---|---|
| CN | 109616506 A | 4/2019 |
| CN | 110429199 A | 11/2019 |
| CN | 110600511 A | 12/2019 |
| CN | 110875440 A | 3/2020 |
| CN | 111133836 A | 5/2020 |
| CN | 111180485 A | 5/2020 |

OTHER PUBLICATIONS

Written Opinion dated Feb. 20, 2021, issued in counterpart Application No. PCT/CN2020/099169. (5 pages).

\* cited by examiner

DISPLAY SUBSTRATE, MANUFACTURING METHOD THEREOF, AND DISPLAY DEVICE

CROSS REFERENCE TO RELATED APPLICATIONS

This application is a Section 371 National Stage Application of International Application No. PCT/CN2020/099169, filed on Jun. 30, 2020, entitled "DISPLAY SUBSTRATE, MANUFACTURING METHOD THEREOF, AND DISPLAY DEVICE," which claims priority to the Chinese Patent Application No. 202010463370.4 filed on May 27, 2020, which is incorporated herein by reference in its entirety.

TECHNICAL FIELD

The present disclosure relates to the field of display technology, and in particular to a manufacturing method of a display substrate, a display substrate, and a display device.

BACKGROUND

A flexible display device is a display device formed based on a flexible substrate material. Since the flexible display device has characteristics of rollability, wide viewing angle, portability and the like, it has been more and more widely used in various display products. Moreover, with the rapid development of full-screen mobile phones, various mobile phone and panel manufacturers are actively researching and developing a technology of forming a hole in screen, hoping to place cameras, speakers, sensors and so on necessary for smartphones under the screen to achieve a true full-screen display. Accordingly, a manufacturing process of forming a hole in the flexible display device has become one of important topics concerned by researchers in the field of display technology.

The above information disclosed in this section is only for the understanding of the background of the inventive concept of the present disclosure. Therefore, the above information may include information that does not constitute the prior art.

SUMMARY

In one aspect, a display substrate is provided, including: a base substrate at least including a pixel area and a hole area; a plurality of sub-pixels on the base substrate, wherein the plurality of sub-pixels are located in the pixel area; a hole in the hole area; a first barrier dam arranged between the sub-pixels and the hole and at least partially surrounding the hole; a second barrier dam on a side of the first barrier dam away from the hole; an organic material layer including at least one film layer, wherein an orthographic projection of the organic material layer on the base substrate falls within the pixel area; and a filling structure, wherein at least a portion of the filling structure is arranged between the hole and the first barrier dam, wherein the filling structure and the at least one film layer of the organic material layer are located in the same layer and include the same material; and wherein an orthographic projection of the first barrier dam on the base substrate has a width smaller than that of an orthographic projection of the second barrier dam on the base substrate.

According to some exemplary embodiments, the filling structure includes a single filling film layer, and the organic material layer includes a planarization layer; and the filling film layer and the planarization layer are located in the same layer and include the same material.

According to some exemplary embodiments, the filling structure includes a first filling film layer and a second filling film layer, and the organic material layer includes a planarization layer and a pixel defining layer; the first filling film layer and the planarization layer are located in the same layer and include the same material; and the second filling film layer and the pixel defining layer are located in the same layer and include the same material.

According to some exemplary embodiments, the display substrate includes a plurality of first barrier dams, and an orthographic projection of one of the plurality of first barrier dams closest to the hole on the base substrate does not overlap an orthographic projection of the filling structure on the base substrate.

According to some exemplary embodiments, the display substrate includes a plurality of first barrier dams, and an orthographic projection of one of the plurality of first barrier dams closest to the hole on the base substrate partially overlaps an orthographic projection of the filling structure on the base substrate.

According to some exemplary embodiments, the display substrate includes a plurality of first barrier dams, and an orthographic projection of the filling structure on the base substrate covers an orthographic projection of one of the plurality of first barrier dams closest to the hole on the base substrate.

According to some exemplary embodiments, the display substrate further includes a functional film layer arranged on a side of the organic material layer close to the base substrate, wherein the functional film layer includes: a first conductive layer on the base substrate; a gate insulating layer on a side of the first conductive layer away from the base substrate; a second conductive layer on a side of the gate insulating layer away from the base substrate; an interlayer dielectric layer on a side of the second conductive layer away from the base substrate; a third conductive layer on a side of the interlayer dielectric layer away from the base substrate; and a passivation layer on a side of the third conductive layer away from the base substrate.

According to some exemplary embodiments, the first barrier dam includes a stacked layer structure, the stacked layer structure including portions which are respectively located in the first conductive layer, the gate insulating layer, the second conductive layer, the interlayer dielectric layer, the third conductive layer and the passivation layer; and the passivation layer includes a first portion located in the first barrier dam, the third conductive layer includes a first portion located in the first barrier dam, and an orthographic projection of the first portion of the passivation layer on the base substrate falls within an orthographic projection of the first portion of the third conductive layer on the base substrate.

According to some exemplary embodiments, an orthographic projection of the filling structure on the base substrate covers the orthographic projection of the first portion of the passivation layer on the base substrate.

According to some exemplary embodiments, the orthographic projection of the filling structure on the base substrate partially overlaps the orthographic projection of the first barrier dam on the base substrate, and an area of an overlapping portion is a half of an area of the orthographic projection of the first barrier dam on the base substrate.

According to some exemplary embodiments, the filling structure includes a first filling portion and a second filling portion that is closer to the first barrier dam than the first filling portion; the first filling portion includes a first surface away from the base substrate, and the second filling portion includes a second surface away from the base substrate; and a vertical distance between the first surface and the base substrate is greater than a vertical distance between the second surface and the base substrate.

According to some exemplary embodiments, the first barrier dam includes a top surface away from the base substrate and a side surface facing the hole, the passivation layer partially covers the top surface of the first barrier dam, and the passivation layer covers the side surface of the first barrier dam.

According to some exemplary embodiments, an area of an orthographic projection of a portion of the passivation layer covering the top surface of the first barrier dam on the base substrate is $3/10 \sim 7/10$ of an area of the orthographic projection of the first portion of the third conductive layer on the base substrate.

According to some exemplary embodiments, orthographic projections of first barrier dams other than the first barrier dam closest to the hole on the base substrate are spaced apart from the orthographic projection of the filling structure on the base substrate.

According to some exemplary embodiments, the display substrate further includes a third barrier dam on a side of the second barrier dam away from the hole, wherein an orthographic projection of the third barrier dam on the base substrate has a width greater than that of the orthographic projection of the second barrier dam on the base substrate.

According to some exemplary embodiments, the display substrate further includes a fourth barrier dam on a side of the third barrier dam away from the hole, wherein an orthographic projection of the fourth barrier dam on the base substrate has a width substantially equal to that of the orthographic projection of the first barrier dam on the base substrate.

According to some exemplary embodiments, the display substrate further includes a functional film layer on a side of the organic material layer close to the base substrate, wherein the functional film layer includes: a barrier layer on the base substrate; a buffer layer on a side of the barrier layer away from the base substrate; a first gate insulating layer on a side of the buffer layer away from the base substrate; a first conductive layer on a side of the first gate insulating layer away from the base substrate; a second gate insulating layer on a side of the first conductive layer away from the base substrate; a second conductive layer on a side of the second gate insulating layer away from the base substrate; an interlayer dielectric layer on a side of the second conductive layer away from the base substrate; and a third conductive layer on a side of the interlayer dielectric layer away from the base substrate.

According to some exemplary embodiments, the filling structure further includes a portion located in at least one of the barrier layer and the buffer layer.

According to some exemplary embodiments, the first barrier dam includes at least a stacked layer structure, the stacked layer structure including portions which are respectively located in the barrier layer, the buffer layer and the third conductive layer; and/or wherein the second barrier dam includes at least a stacked layer structure, the stacked layer structure including portions which are respectively located in the planarization layer and the pixel defining layer; and/or wherein the third barrier dam includes at least a stacked layer structure, the stacked layer structure including portions which are respectively located in the planarization layer and the pixel defining layer; and/or wherein the fourth barrier dam includes at least a stacked layer structure, the stacked layer structure including portions which are respectively located in the barrier layer, the buffer layer and the third conductive layer.

According to some exemplary embodiments, a cross section of each of the first barrier dam and the second barrier dam is trapezoidal, the cross section is perpendicular to a surface of the base substrate where the first barrier dam and the second barrier dam are arranged, and the cross section extends in a first direction directed from the hole area to the pixel area; and a smallest dimension of a width of the first barrier dam is $1/4 \sim 3/8$ of that of the second barrier dam, and a largest dimension of the width of the first barrier dam is $3/10 \sim 2/5$ of that of the second barrier dam.

According to some exemplary embodiments, a cross section of each of the first barrier dam and the third barrier dam is trapezoidal, the cross section is perpendicular to a surface of the base substrate where the first barrier dam and the third barrier dam are arranged, and the cross section extends in a first direction directed from the hole area to the pixel area; and a smallest dimension of a width of the first barrier dam is $1/16 \sim 3/16$ of that of the third barrier dam, and a largest dimension of the width of the first barrier dam is $3/20 \sim 1/5$ of that of the third barrier dam.

According to some exemplary embodiments, a material of the organic material layer includes at least one selected from polymethylmethacrylate, polycarbonate, polystyrene, epoxy resin, polyimide and polyethylene.

According to some exemplary embodiments, the base substrate is a flexible base substrate, and the display substrate further includes a back film arranged on a surface of the base substrate away from the organic material layer.

In another aspect, a display device including the display substrate as described above is provided.

In a further aspect, a manufacturing method of a display substrate is provided, including steps of: providing a base substrate including at least a pixel area and a cutting area; forming a functional film layer including at least an inorganic material layer on the base substrate, wherein an orthographic projection of a portion of the inorganic material layer on the base substrate falls within the pixel area, and an orthographic projection of the other portion of the inorganic material layer on the base substrate covers the cutting area; removing at least a portion of the inorganic material layer in the cutting area so as to form a groove in the cutting area of the base substrate; forming an organic material layer on the base substrate; attaching a back film to a surface of the base substrate away from the functional film layer and the organic material layer; and performing a cutting process to form a hole, wherein, in the cutting process, a cutting line is located in the cutting area, wherein the step of forming an organic material layer on the base substrate includes: forming the organic material layer on a side of the functional film layer away from the base substrate, so that an orthographic projection of a portion of the organic material layer on the base substrate falls within the pixel area, and an orthographic projection of the other portion of the organic material layer on the base substrate covers the cutting area, thereby the other portion of the organic material layer forms a filling structure for filling the groove.

According to some exemplary embodiments, the organic material layer includes a planarization layer.

According to some exemplary embodiments, the organic material layer includes a planarization layer and a pixel defining layer.

According to some exemplary embodiments, the manufacturing method further includes forming a first barrier dam on the base substrate, wherein the first barrier dam surrounds the cutting area.

According to some exemplary embodiments, an orthographic projection of the filling structure on the base substrate does not overlap an orthographic projection of the first barrier dam on the base substrate.

According to some exemplary embodiments, an orthographic projection of the filling structure on the base substrate partially overlaps an orthographic projection of the first barrier dam on the base substrate.

According to some exemplary embodiments, an orthographic projection of the filling structure on the base substrate covers an orthographic projection of the first barrier dam on the base substrate.

According to some exemplary embodiments, in the step of attaching a back film to a surface of the base substrate away from the functional film layer and the organic material layer, pressure is applied to attach the back film to the base substrate such that a portion of the base substrate located in the cutting area and a portion of the base substrate located in the pixel area both attach to the back film.

According to some exemplary embodiments, the step of forming a functional film layer on the base substrate includes forming a barrier layer, a buffer layer, a first conductive layer, a gate insulating layer, a second conductive layer, an interlayer dielectric layer, a third conductive layer and a passivation layer sequentially on the base substrate; and the inorganic material layer includes at least one of the barrier layer, the buffer layer, the gate insulating layer and the interlayer dielectric layer.

According to some exemplary embodiments, in the step of forming an organic material layer on a side of the functional film layer away from the base substrate, a surface of the planarization layer away from the base substrate includes a first planarization layer surface portion and a second planarization layer surface portion, an orthographic projection of the first planarization layer surface portion on the base substrate at least partially overlaps an orthographic projection of the cutting area on the base substrate, and an orthographic projection of the second planarization layer surface portion on the base substrate at least partially overlaps an orthographic projection of the first barrier dam on the base substrate; a vertical distance d1 between the first planarization layer surface portion and a reference plane at a first position is less than a vertical distance d2 between the first planarization layer surface portion and the reference plane at a second position, and the vertical distance d2 is less than a vertical distance d3 between the second planarization layer surface portion and the reference plane; and the reference plane is a surface of the interlayer dielectric layer away from the base substrate, an orthographic projection of the first position on the base substrate falls within an orthographic projection of the cutting area on the base substrate, an orthographic projection of the second position on the base substrate falls within an orthographic projection of an adjoining portion between the cutting area and the first barrier dam on the base substrate, and an orthographic projection of the third position on the base substrate falls within the orthographic projection of the first barrier dam on the base substrate.

According to some exemplary embodiments, in the step of removing at least a portion of the inorganic material layer located in the cutting area, the portion of the inorganic material layer located in the cutting area is removed by an etching process.

According to some exemplary embodiments, the step of performing a cutting process to form a hole includes: performing a laser cutting process so that a track projected by a laser on the base substrate falls within the groove to form a hole penetrating the back film, the base substrate, the functional film layer and the filling structure.

According to some exemplary embodiments, the first planarization layer surface portion has a slope angle in a range of 10~18 degrees.

According to some exemplary embodiments, a difference between the vertical distance d2 and the vertical distance d1 is in a range of 100~300 nanometers.

According to some exemplary embodiments, a difference between the vertical distance d3 and the vertical distance d2 is in a range of 150~500 nanometers.

BRIEF DESCRIPTION OF THE DRAWINGS

By describing in detail exemplary embodiments of the present disclosure with reference to the drawings, the features and advantages of the present disclosure will become more apparent.

DETAILED DESCRIPTION OF EMBODIMENTS

Figure 1:
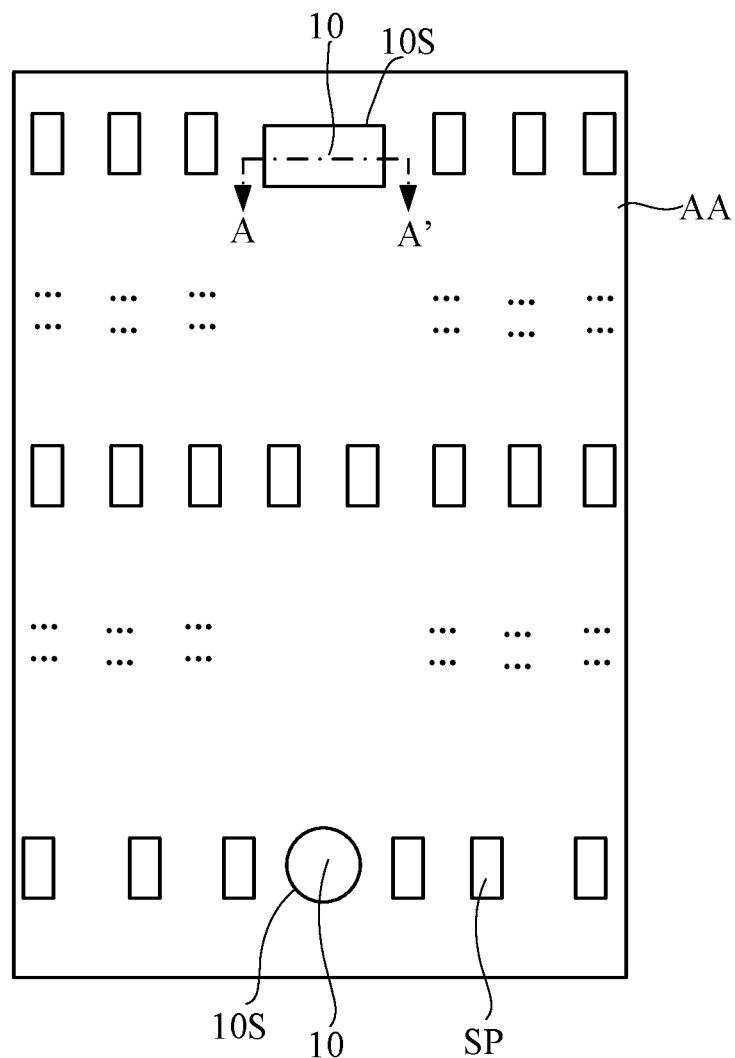
FIG. 1 shows a plan view of a display substrate according to some exemplary embodiments of the present disclosure.

In order to make objectives, technical solutions and advantages of the present disclosure more clear, the technical solutions of the embodiments of the present disclosure are clearly and completely described below with reference to the drawings. Obviously, the described embodiments are only a part but not all of the embodiments of the present disclosure. Based on the embodiments of the present disclosure, all other embodiments obtained by those skilled in the art without carrying out creative work fall within the protection scope of the present disclosure.

It should be noted that, in the drawings, for clarity and/or description purposes, dimension and relative dimension of elements may be enlarged. Accordingly, the dimension and relative dimension of each element need not to be limited to those shown in the drawings. In the specification and drawings, the same or similar reference numerals indicate the same or similar components.

When an element is described as being "on", "connected to" or "coupled to" another element, the element may be directly on the other element, directly connected to the other element, or directly coupled to the other element, or an intermediate element may be present. However, when an element is described as being "directly on", "directly connected to" or "directly coupled to" another element, no intermediate element is present. Other terms and/or expressions used to describe the relationship between elements, for example, "between" and "directly between", "adjacent" and "directly adjacent", "above" and "directly above", should be interpreted in a similar manner. In addition, the term "connection" may refer to a physical connection, an electrical connection, a communication connection, and/or a fluid connection. In addition, X axis, Y axis and Z axis are not limited to three axes of a rectangular coordinate system, and may be interpreted in a broader meaning. For example, the X axis, Y axis and Z axis may be perpendicular to each other, or may represent different directions that are not perpendicular to each other. For the objective of the present disclosure, "at least one of X, Y and Z" and "at least one selected from a group consisting of X, Y and Z" may be interpreted as only X, only Y, only Z, or any combination of two or more of X, Y and Z, such as XYZ, XYY, YZ and ZZ. As used herein, the term "and/or" includes any and all combinations of one or more of the listed related items.

It should be noted that although the terms "first", "second", and so on may be used herein to describe various components, members, elements, regions, layers and/or parts, these components, members, elements, regions, layers and/or parts should not be limited by these terms. Rather, these terms are used to distinguish one component, member, element, region, layer and/or part from another. Thus, for example, a first component, a first member, a first element, a first region, a first layer and/or a first part discussed below may be referred to as a second component, a second member, a second element, a second region, a second layer and/or a second part without departing from the teachings of the present disclosure.

For ease of description, spatial relationship terms, such as "upper", "lower", "left", "right", may be used herein to describe the relationship between one element or feature and another element or feature as shown in the figure. It should be understood that the spatial relationship terms are intended to cover other different orientations of the device in use or operation in addition to the orientation described in the figure. For example, if the device in the figure is turned upside down, an element or feature described as "below" or "under" another element or feature will be oriented "above" or "on" the other element or feature.

In the present disclosure, unless otherwise specified, the terms "substantially", "basically", "about", "approximately" and other similar terms are used as terms of approximation rather than as terms of degree, and they are intended to explain the inherent deviation of the measured or calculated value that will be recognized by those skilled in the art. Taking into account actual process errors, measurement problems, and errors related to measurement of specific quantities (that is, limitations of a measurement system), the terms "substantially", "basically", "about" or "approximately" used in the present disclosure includes the stated value and means that the specific value determined by those skilled in the art is within an acceptable range of deviation. For example, "substantially", "basically", "about" or "approximately" may mean to fall within one or more standard deviations, or fall within ±10% or ±5% of the stated value.

In the present disclosure, unless otherwise specified, the term "same layer" used means that two layers, components, members, elements or parts may be formed by the same patterning process, and the two layers, components, members, elements or parts are generally formed of the same material.

In the present disclosure, unless otherwise specified, the expression "patterning process" generally includes steps of photoresist coating, exposure, development, etching, and photoresist stripping. The expression "one-time/one patterning process" means a process of forming patterned layers, components elements and so on using one mask.

Embodiments of the present disclosure provide a display substrate and a manufacturing method thereof. The display substrate includes: a base substrate at least including a pixel area and a hole area; a plurality of sub-pixels arranged on the base substrate, wherein the plurality of sub-pixels are located in the pixel area; a hole located in the hole area; a first barrier dam arranged between the sub-pixels and the hole and at least partially surrounding the hole; an organic material layer including at least one film layer, wherein an orthographic projection of the organic material layer on the base substrate falls within the pixel area; and a filling structure, wherein at least a portion of the filling structure is arranged between the hole and the first barrier dam, wherein the filling structure and the at least one film layer of the organic material layer are located in the same layer and contain the same material. The manufacturing method of the display substrate includes: providing a base substrate at least including a pixel area and a hole area; forming a functional film layer including at least an inorganic material layer on the base substrate, wherein an orthographic projection of a portion of the inorganic material layer on the base substrate falls within the pixel area, and an orthographic projection of the other portion of the inorganic material layer on the base substrate covers the cutting area; removing at least a portion of the inorganic material layer located in the cutting area so as to form a groove in the cutting area of the base substrate; forming an organic material layer on the base substrate; attaching a back film to a surface of the base substrate away from the functional film layer and the organic material layer; and performing a cutting process to form a hole, wherein a cutting line is located in the cutting area, wherein the step of forming an organic material layer on the base substrate includes: forming the organic material layer on a side of the functional film layer away from the base substrate, so that an orthographic projection of a portion of the organic material layer on the base substrate falls within the pixel area, and an orthographic projection of the other portion of the organic material layer on the base substrate covers the cutting area so that the other portion of the organic material layer forms a filling structure for filling the groove.

In the above display substrate and the manufacturing method thereof, by filling the groove with the organic material layer, it may be ensured that no bubbles are generated in the process of attaching the back film. Therefore, in the cutting process, generation of cutting cracks in the film layers in the pixel area and/or separation of the film layers in the pixel area from each other may be avoided, thereby improving the product yield.

FIG. 1 shows a plan view of a display substrate according to some exemplary embodiments of the present disclosure. For example, the display substrate may be an electroluminescent display substrate, such as an OLED display substrate. For example, the display substrate may be a flexible display substrate.

As shown in FIG. 1, the display substrate includes a display area AA and at least one hole 10 located in the display area AA. In FIG. 1, two holes 10 are provided as an example for illustration. It should be understood that the embodiments of the present disclosure are not limited to this. In other embodiments, less (for example, one) or more holes 10 may be provided.

It should be noted that the "hole" mentioned in the present disclosure refers to an area on the display substrate for installing a hardware structure, which is called a hole in the present disclosure for the convenience of description. The hole includes but is not limited to forms of a through hole, a groove, an opening, or the like. Optionally, the hardware structure may include one or more of structures of a front camera, a HOME key, an earpiece or a speaker. The specific installation manner of the hardware structure is not particularly limited in the embodiments of the present disclosure. In addition, a shape of the hole may be determined according to a shape of the hardware structure to be installed. For example, a cross section of the hole in a direction parallel to the base substrate of the display substrate may have one or more of shapes of a circle, an oval, a rectangle, a rounded rectangle, a square, a diamond, a trapezoid, or the like.

In the embodiments of the present disclosure, by providing the hole in the display area and installing a hardware structure such as a camera in the hole, functions such as under-screen camera may be realized, thereby increasing a screen-to-body ratio and achieving a full screen effect.

For example, in order to form the above-mentioned hole 10, a cutting process such as a laser cutting may be used to form the hole penetrating the display substrate. During the laser cutting, a laser needs to be projected onto the display substrate. In some embodiments, the laser needs to move relative to the display substrate, and a track of the laser projected onto the display substrate forms a cutting line or a cutting path. It should be understood that the cutting line or cutting path may extend along an outer peripheral edge 10S of the hole 10 (as shown in FIG. 1).

It should be noted that, in the present disclosure, for the convenience of description, an area where the hole 10 is located may be referred to as a hole area, an area of the display area AA except for the hole 10 is referred to as a pixel area, and an area where the cutting line or the cutting path is located is referred to as a cutting area. Referring to FIG. 1, a plurality of sub-pixels SP may be provided in the pixel area. For example, the sub-pixels SP may include red sub-pixels, green sub-pixels and blue sub-pixels.

Figure 2:
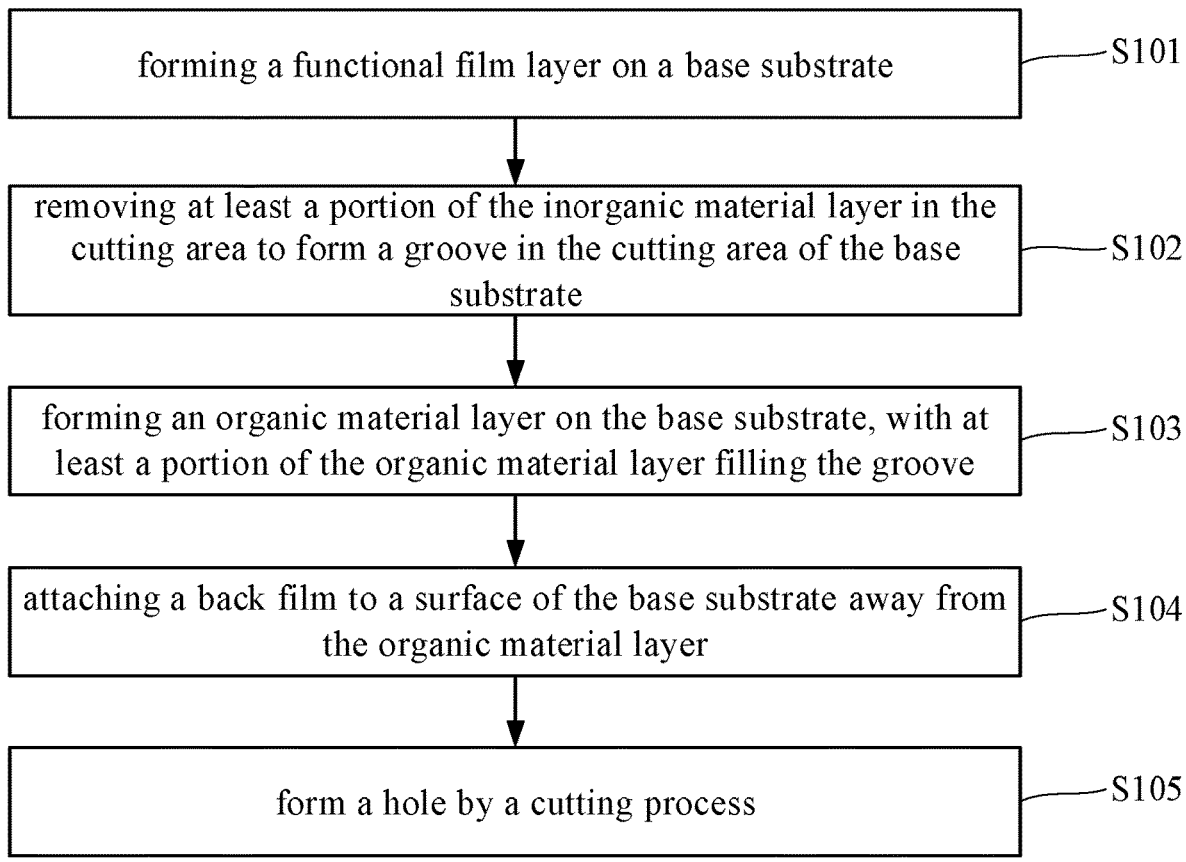
FIG. 2 is a flowchart of a manufacturing method of a display substrate according to some exemplary embodiments of the present disclosure.

FIG. 2 shows a flowchart of a manufacturing method of a display substrate according to some exemplary embodiments of the present disclosure. FIGS. 3A to 3F respectively show cross-sectional views of the display substrate after some steps of the manufacturing method of the display substrate according to some exemplary embodiments of the present disclosure are performed, and these cross-sectional views show cross-sections taken along line AA' in FIG. 1. With reference to FIG. 2 and FIGS. 3A to 3F in combination, the manufacturing method may include step S101 to step S105.

Figure 3A:
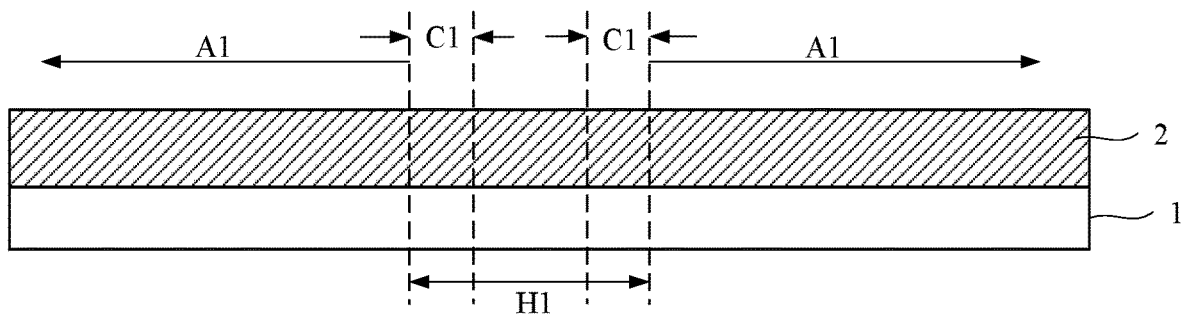
FIGS. 3A to 3F respectively show cross-sectional views of the display substrate after some steps of the manufacturing method of the display substrate according to some exemplary embodiments of the present disclosure are performed, wherein these cross-sectional views are taken along line AA' in FIG. 1.

Referring to FIG. 3A, in step S101, a functional film layer is formed on a base substrate 1.

Prior to the step S101, the manufacturing method may include a step of providing the base substrate 1.

For example, the base substrate 1 may be a flexible base substrate. A material constituting the flexible base substrate includes but is not limited to polyimide (PI), polyethylene terephthalate (PET), polycarbonate, polyethylene, polyacrylate, polyetherimide or polyethersulfone.

Referring to FIG. 1 and FIG. 3A in combination, the base substrate 1 may include the display area AA, and the display area AA may include a pixel area A1 and a hole area H1 where a hole is to be formed. As described above, a cutting area C1 is formed on an outer periphery of the hole area H1, and a cutting line or a cutting path is located in the cutting area C1. It should be understood that an orthographic projection of the cutting area C1 on the base substrate 1 is a closed pattern, for example, a circle (or a circular ring).

In some exemplary embodiments, as shown in FIG. 3A, the functional film layer may include at least an inorganic material layer 2. The inorganic material layer 2 covers the display area AA, that is, it covers the pixel area A1, the hole area H1 and the cutting area C1. In other words, an orthographic projection of a portion of the inorganic material layer 2 on the base substrate 1 falls within the pixel area A1, and an orthographic projection of the other portion of the inorganic material layer 2 on the base substrate 1 covers the cutting area C1.

It should be noted that the inorganic material layer 2 may include a single inorganic material layer formed of an inorganic insulating material, but the embodiments of the present disclosure are not limited thereto. The inorganic material layer 2 may also include a stacked layer including a plurality of inorganic material layers formed of inorganic insulating materials.

Figure 3B:
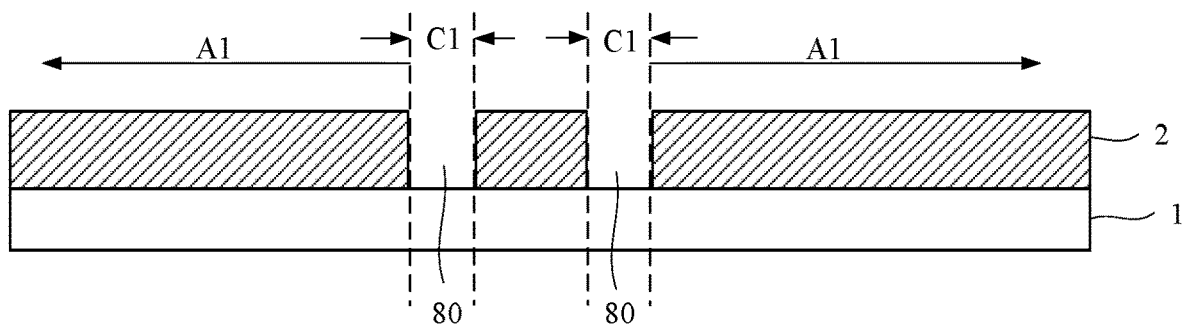

Referring to FIG. 3B, in step S102, at least a portion of the inorganic material layer 2 located in the cutting area C1 is removed. In this way, a groove 80 is formed in the cutting area C1 of the base substrate 1.

It should be understood that an orthographic projection of the groove 80 on the base substrate 1 is a closed pattern. For example, the orthographic projection of the groove 80 on the base substrate 1 is a circle, a rectangle, or the like. The area surrounded by the groove 80 is the hole to be formed.

For example, the portion of the inorganic material layer 2 located in the cutting area C1 may be removed by an etching process.

The inventor found through research that inorganic materials (especially inorganic insulating materials) generally have poor flexibility, and cutting cracks are prone to being generated in inorganic materials during the cutting process. In the embodiments of the present disclosure, the portion of the inorganic material layer located in the cutting area is removed. In this way, in subsequent cutting processing for forming the hole, the risk of cutting cracks generated in the inorganic material layer may be reduced, and the cutting cracks may be prevented from extending along the inorganic material layer to the pixel area. Therefore, the risk of cracks generated in the film layer in the pixel area may be reduced or avoided, thereby improving the product yield.

Figure 3C:
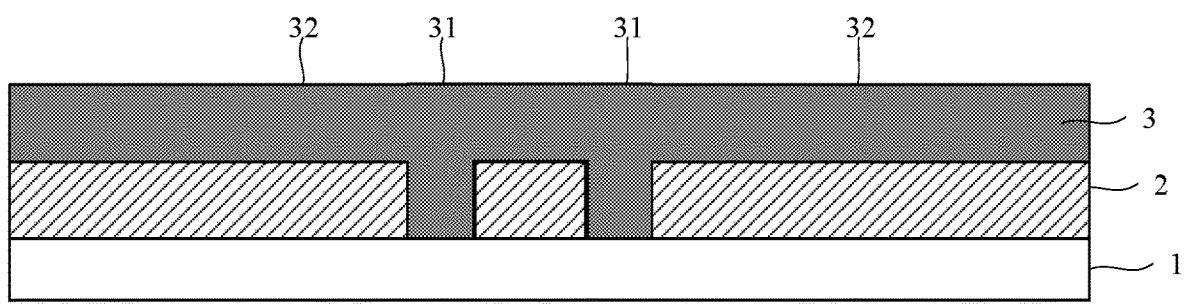

Referring to FIG. 3C, in step S103, an organic material layer 3 is formed on the base substrate 1, and at least a portion of the organic material layer 3 fills the groove 80.

For example, the organic material layer 3 covers the display area AA, that is, it covers the pixel area A1 and the hole area H1. For example, the organic material layer 3 covers the pixel area A1 and the cutting area C1. In other words, an orthographic projection of a portion of the organic material layer 3 on the base substrate 1 falls within the pixel area A1, and an orthographic projection of the other portion of the organic material layer 3 on the base substrate 1 covers the cutting area C1.

It should be noted that FIG. 3C schematically shows that the organic material layer 3 extends continuously in both the pixel area A1 and the hole area H1. However, this should not be understood as a limitation to the embodiments of the present disclosure. It should be understood that a portion of the organic material layer 3 in the pixel area A1 may be disconnected from a portion of the organic material layer 3 in the hole area H1.

In the embodiments of the present disclosure, the organic material layer 3 fills the groove 80, so that a surface of the organic material layer 3 away from the base substrate 1 includes a first surface portion 31 located in the cutting area C1 and a second surface portion 32 located in the pixel area A1. The first surface portion 31 and the second surface portion 32 may be substantially flush, that is, a vertical distance between the first surface portion 31 and the base substrate 1 is substantially equal to a vertical distance between the second surface portion 32 and the base substrate 1. It should be understood that the second surface portion 32 here should be understood as a portion of an upper surface of the film layer located on top of the pixel area A1.

In this way, by filling the cutting area C1 with the organic material layer 3, a thickness difference of the film layers between in the cutting area and in the pixel area caused by the groove 80 may be eliminated, thereby facilitating subsequent processing.

Figure 3D:
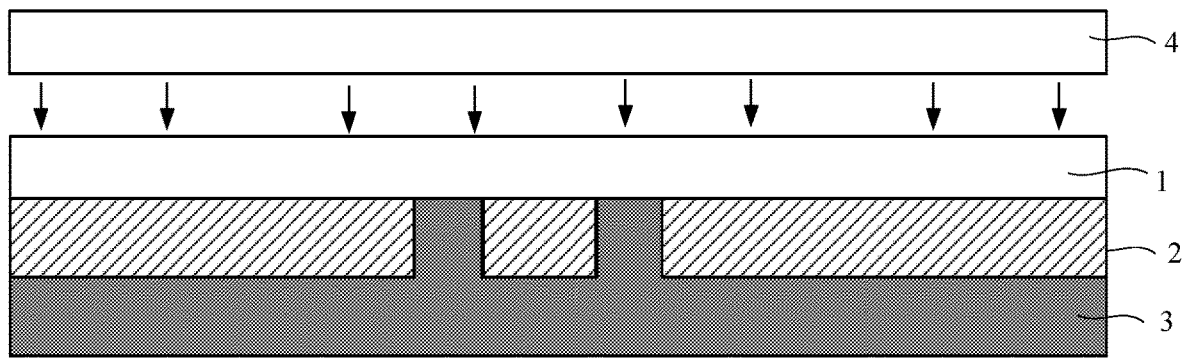

Referring to FIG. 3D, in step S104, a back film 4 is attached to a surface of the base substrate 1 away from the organic material layer 3.

For example, the back film 4 may include but is not limited to polyimide (PI) material to enhance the strength of the base substrate 1 so as to provide better supporting force for each film layer on the base substrate 1.

Figure 4A:
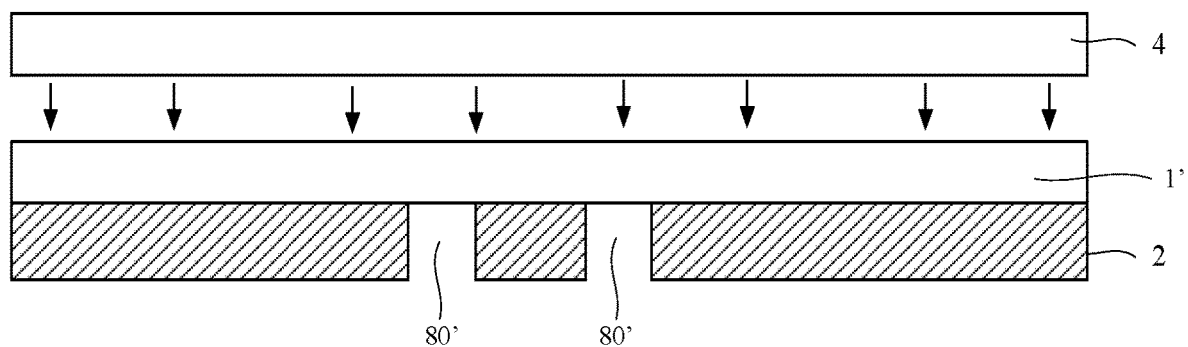
FIGS. 4A and 4B respectively show schematic views of a process of attaching the back film in the comparative embodiments.
Figure 4B:
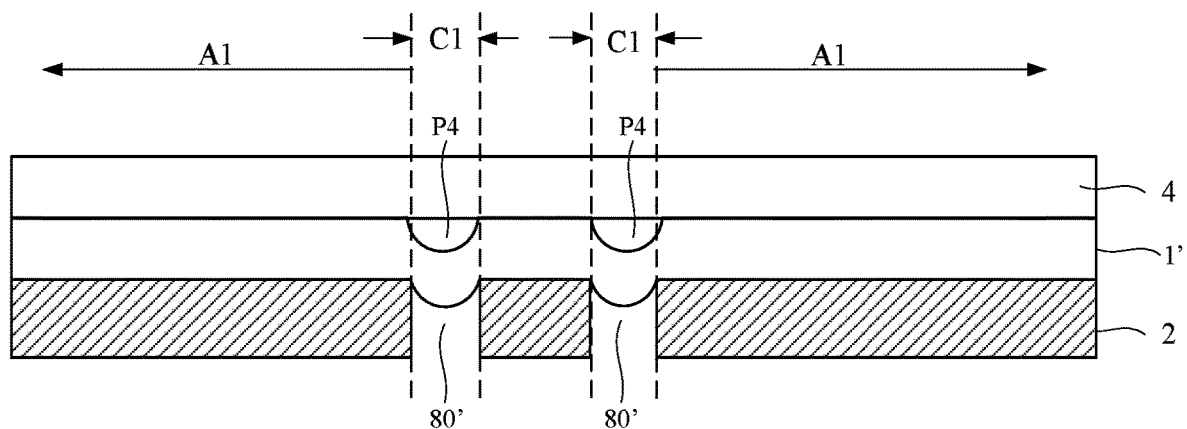

FIGS. 4A and 4B respectively show schematic views of the process of attaching the back film in the comparative embodiments. In the embodiments shown in FIGS. 4A and 4B, after a groove 80' is formed, the groove 80' is not filled with the organic material layer, that is, the above step S103 is not performed.

Referring to FIG. 4A, a back film 4 is attached to a base substrate 1' provided with the groove 80'. It should be understood that, due to the groove 80', a thickness of the film layer (such as the inorganic material layer 2) in the cutting area C1 of the base substrate 1' is smaller than that of the film layer (such as the inorganic material layer 2) in the pixel area A1 of the base substrate 1'. That is, the film layer in the cutting area C1 of the base substrate 1' is relatively thin.

Referring to FIG. 4B, in the attaching process, a certain attaching pressure needs to be applied to make the base substrate 1' and the back film 4 better adhere to each other. Under the action of the attaching pressure, the film layer which is relatively thin (that is, the film layer in the cutting area C1) moves in a direction away from the back film 4, thereby generating a bubble P4 in the cutting area C1.

In the subsequent laser cutting process, when the laser is applied to the cutting area C1, a temperature of the cutting area C1 will rise sharply, and the air in the bubble P4 will also expand sharply, causing cutting cracks in the film layers in the pixel area, and/or causing separation of the film layers in the pixel area from each other, which adversely affects the product yield.

Referring back to FIG. 3D, the groove 80 is filled with the organic material layer 3, and the thickness of the film layers in the cutting area C1 of the base substrate 1 is relatively large. Thus, in the process of attaching the back film 4 to the base substrate 1, generation of the bubble in the cutting area C1 is avoided. Since the bubble is not generated in the process of attaching the back film, cutting cracks in the film layers in the pixel area and/or separation of the film layers in the pixel area from each other are avoided, thereby improving the product yield.

Figure 3E:
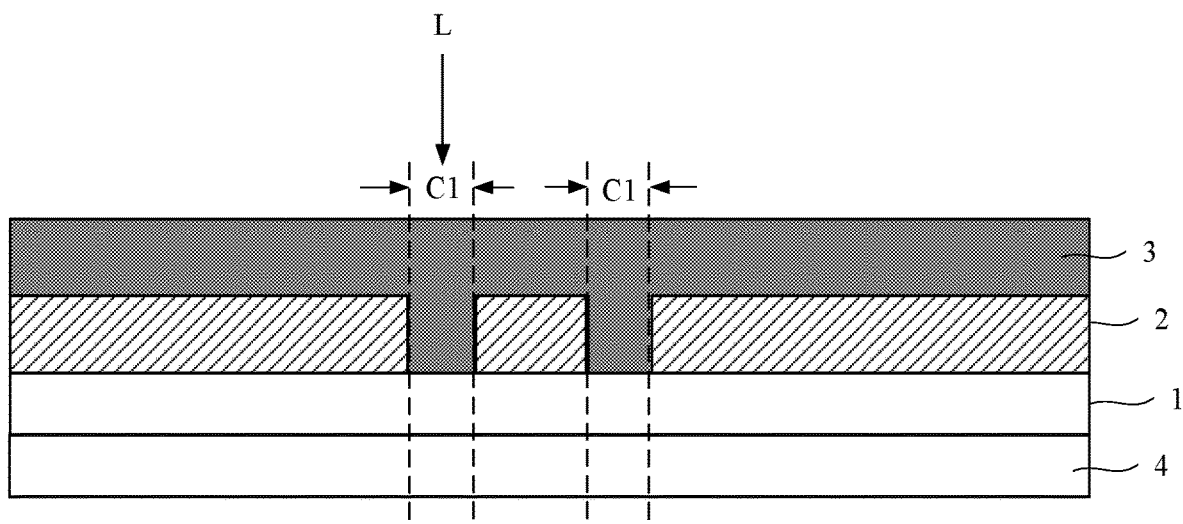
Figure 3F:
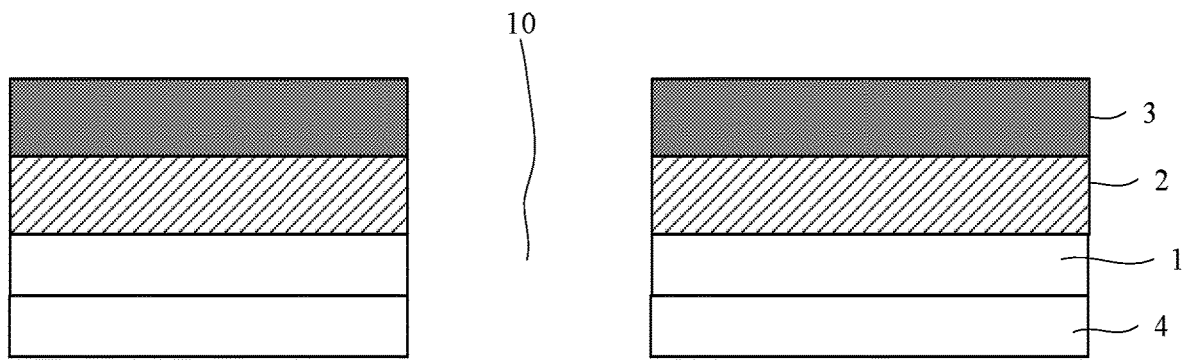

Referring to FIG. 3E and FIG. 3F in combination, in step S105, the hole 10 is formed by a cutting process.

For example, the hole 10 may be formed by a laser cutting process.

Referring to FIG. 3E, a laser L is projected to the cutting area C1. In order to form a circular hole 10, referring to FIG. 1 and FIG. 3E in combination, the cutting area C1 may be circular. The laser L may move relative to the base substrate 1 to form a circular trace, which corresponds to the cutting area C1. In this way, the hole 10 penetrating the back film 4, the base substrate 1 and the film layers thereon may be formed, as shown in FIG. 3F.

Since the bubble is not generated in the process of attaching the back film, cutting cracks in the film layers in the pixel area and/or separation of the film layers in the pixel area from each other are avoided in the cutting process, thereby improving the product yield.

Hereinafter, an organic light-emitting diode (OLED) flexible display substrate is illustrated by way of example to describe the embodiments of the present disclosure in detail. It should be understood that the electroluminescent device in the embodiments of the present disclosure is not limited to the OLED device, and it may include other types of electroluminescent devices, such as a QLED device.

Figure 5:
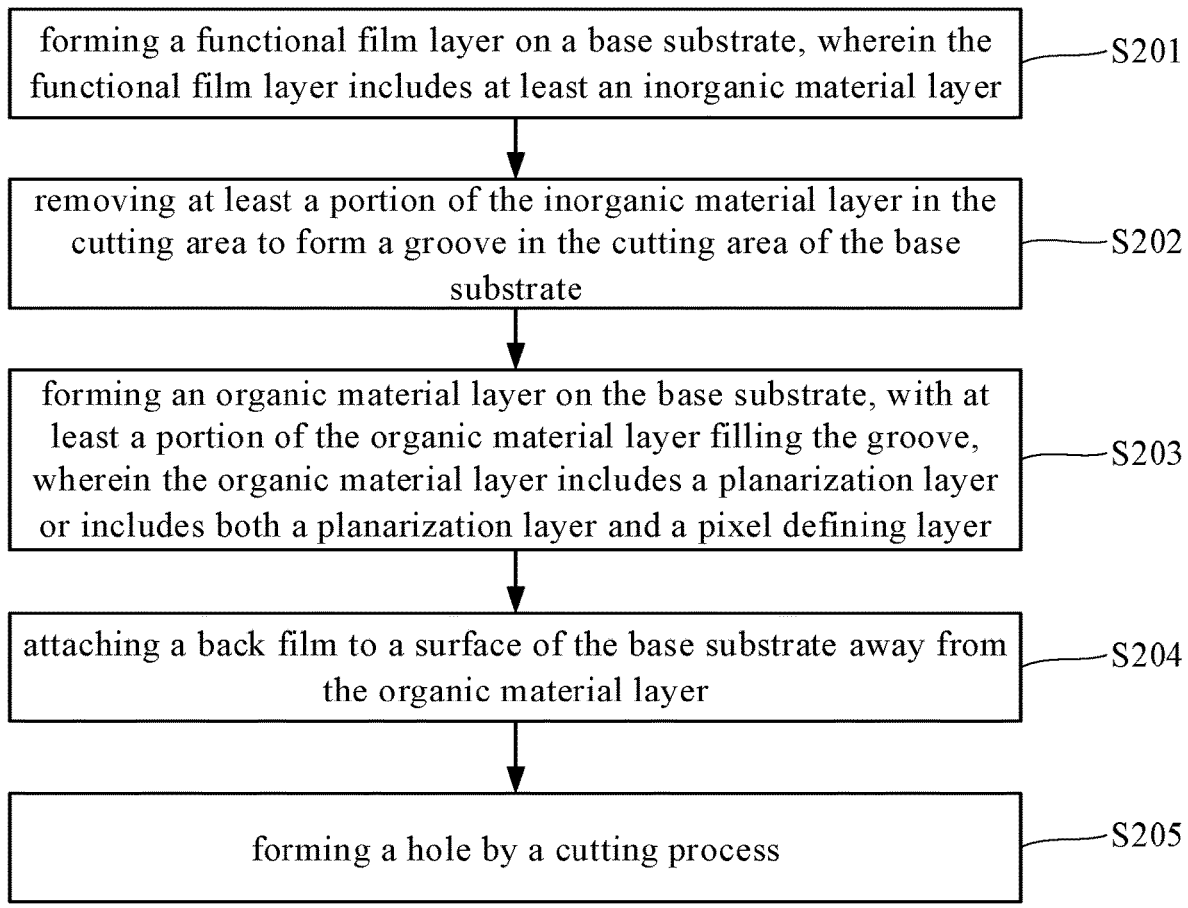
FIG. 5 shows a flowchart of a manufacturing method of a display substrate according to some exemplary embodiments of the present disclosure.

FIG. 5 shows a flowchart of a manufacturing method of a display substrate according to some exemplary embodiments of the present disclosure. FIGS. 6A to 6E, FIG. 7, and FIGS. 9 to 10 respectively show cross-sectional views of the display substrate after some steps of the manufacturing method of the display substrate according to some exemplary embodiments of the present disclosure are performed, and these cross-sectional views show cross-sections taken along line AA' in FIG. 1. FIG. 8 is a partial enlarged view of part I in FIG. 7. With reference to FIG. 5, FIGS. 6A-6E, FIG. 7 and FIGS. 9 to 10 in combination, the manufacturing method may include step S201 to step S205.

Figure 6A:
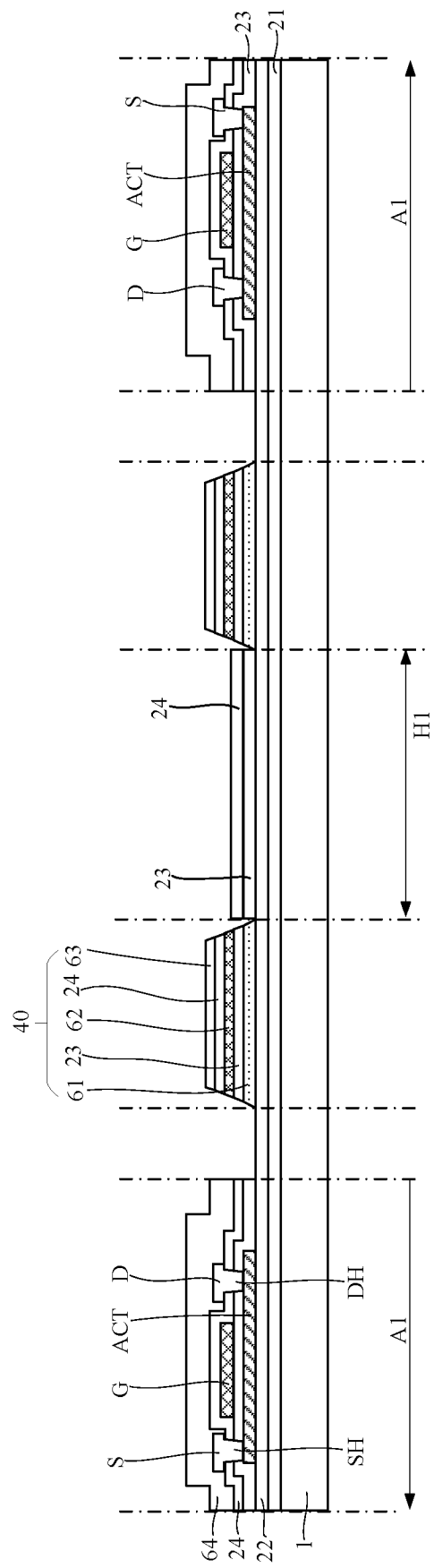
FIGS. 6A to 6E, FIG. 7, and FIGS. 9 to 10 respectively show cross-sectional views of the display substrate after some steps of the manufacturing method of the display substrate according to some exemplary embodiments of the present disclosure are performed, wherein these cross-sectional views are taken along line AA' in FIG. 1.

Referring to FIG. 6A, in step S201, a functional film layer is formed on the base substrate 1.

For example, the functional film layer may include a barrier layer 21 and a buffer layer 22. Each of the barrier layer 21 and the buffer layer 22 may contain an inorganic insulating material, for example, oxides of silicon, nitrides of silicon or nitrogen oxides of silicon, such as silicon oxide, silicon nitride or silicon oxynitride, or an insulating material containing metal elements, such as aluminum oxide or titanium nitride. For example, the barrier layer 21 and the buffer layer 22 may be formed by a process such as chemical vapor deposition process.

For example, the functional film layer may further include a driving circuit layer including a thin film transistor for driving the light emitting device to emit light.

Here, the thin film transistor being a top-gate TFT is illustrated by way of example to further describe the embodiments of the present disclosure in detail. Referring to FIG. 6A, the driving circuit layer may include: an active layer ACT arranged on the base substrate 1, a gate insulating layer 23 arranged on a side of the active layer ACT away from the base substrate 1, a gate electrode G arranged on a side of the gate insulating layer 23 away from the base substrate 1, an interlayer dielectric layer 24 arranged on a side of the gate electrode G away from the base substrate 1 and covering the gate electrode G, and a conductive layer arranged on a side of the interlayer dielectric layer 24 away from the base substrate 1. The conductive layer may include a source electrode S and a drain electrode D of the thin film transistor as well as conductive plugs SH and DH formed in via holes in the interlayer dielectric layer 24. The source electrode S and the drain electrode D of the thin film transistor are electrically connected to the active layer ACT through the respective conductive plugs SH and DH.

Each of the gate insulating layer 23 and the interlayer dielectric layer 24 may contain an inorganic insulating material, for example, oxides of silicon, nitrides of silicon or nitrogen oxides of silicon, such as silicon oxide, silicon nitride or silicon oxynitride, or an insulating material containing metal elements, such as aluminum oxide or titanium nitride.

Thus, in some exemplary embodiments, the inorganic material layer 2 of the functional film layer may include at least one of the barrier layer 21, the buffer layer 22, the gate insulating layer 23 and the interlayer dielectric layer 24. For example, the inorganic material layer 2 may include all of the barrier layer 21, the buffer layer 22, the gate insulating layer 23 and the interlayer dielectric layer 24, or the inorganic material layer 2 may include both the gate insulating layer 23 and the interlayer dielectric layer 24. In other words, an orthographic projection of a portion of each of the barrier layer 21, the buffer layer 22, the gate insulating layer 23 and the interlayer dielectric layer 24 on the base substrate 1 falls within the pixel area A1, and an orthographic projection of the other portion thereof on the base substrate 1 covers the cutting area C1.

For example, the functional film layer includes: a first conductive layer 61 arranged on the base substrate; a gate insulating layer 23 arranged on a side of the first conductive layer away from the base substrate; a second conductive layer 62 arranged on a side of the gate insulating layer away from the base substrate; an interlayer dielectric layer 24 arranged on a side of the second conductive layer away from the base substrate; and a third conductive layer 63 arranged on a side of the interlayer dielectric layer away from the base substrate. The gate electrode G of the thin film transistor may be located in the first conductive layer 61. That is, the first conductive layer 61 and the gate electrode G may be formed of the same material through the same patterning process. The source electrode S and the drain electrode D of the thin film transistor may be located in the third conductive layer 63. That is, the third conductive layer 63, the source electrode S and the drain electrode D may be formed of the same material through the same patterning process. It should be understood that the second conductive layer 62 may be formed of a gate conductive material.

In the step S201, while forming the functional film layer, a first barrier dam 40 may be formed on the base substrate 1. For example, the first barrier dam 40 surrounds the cutting area C1 or the hole area H1. For example, the first barrier dam 40 may be arranged along a circumference of the cutting area C1 or the hole area H1, that is, it completely surrounds the cutting area C1 or the hole area H1. However, the embodiments of the present disclosure are not limited thereto, and the first barrier dam 40 may partially surround the cutting area C1 or the hole area H1. In other words, in the embodiments of the present disclosure, the first barrier dam 40 may at least partially surround the cutting area C1 or the hole area H1.

For example, the first barrier dam 40 includes a stacked layer structure, the stacked layer structure including portions which are respectively located in the first conductive layer 61, the gate insulating layer 23, the second conductive layer 62, the interlayer dielectric layer 24 and the third conductive layer 63.

Figure 6B:
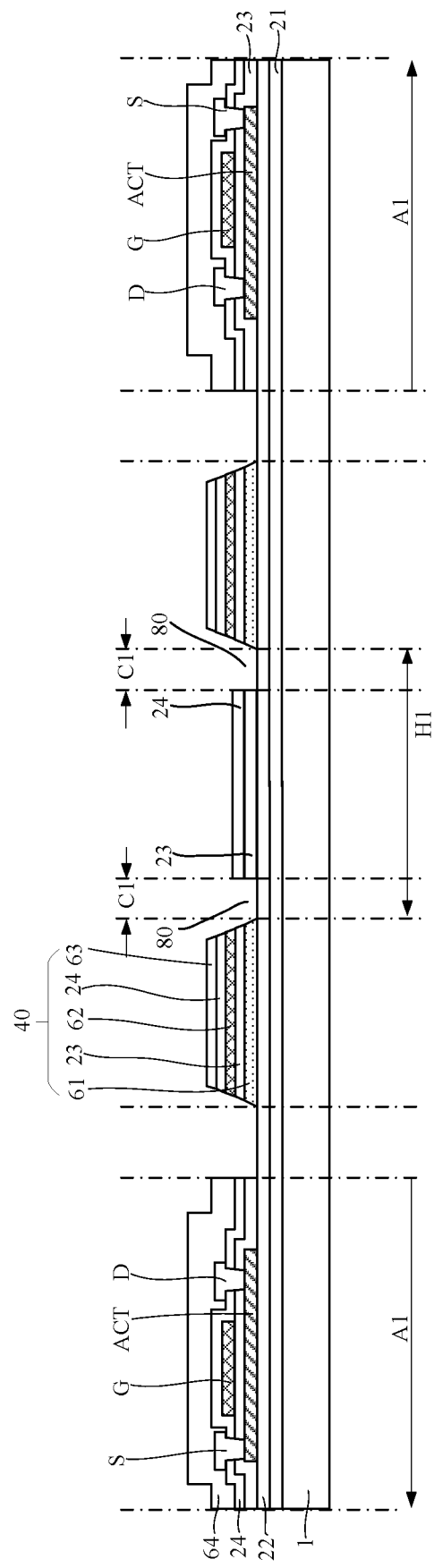

Referring to FIG. 6B, in step S202, at least the portion of the inorganic material layer 2 located in the cutting area C1 is removed. In this way, a groove 80 is formed in the cutting area C1 of the base substrate 1.

For example, the portion of the inorganic material layer 2 located in the cutting area C1 may be removed by an etching process.

In the embodiments shown in FIG. 6B, the portion of each of the gate insulating layer 23 and the interlayer dielectric layer 24 located in the cutting area C1 may be removed by an etching process to form the groove 80. However, the embodiments of the present disclosure are not limited thereto. For example, the portion of each of the barrier layer 21, the buffer layer 22, the gate insulating layer 23 and the interlayer dielectric layer 24 located in the cutting region C1 may be removed by an etching process to form the groove 80.

It should be noted that in the above embodiments, the first conductive layer including the source electrode S and the drain electrode D of the thin film transistor is formed in step S201, that is, prior to forming the groove 80. However, the embodiments of the present disclosure are not limited thereto. The above-mentioned first conductive layer including the source electrode S and the drain electrode D of the thin film transistor may also be formed after step S202, that is, after forming the groove 80.

Figure 6C:
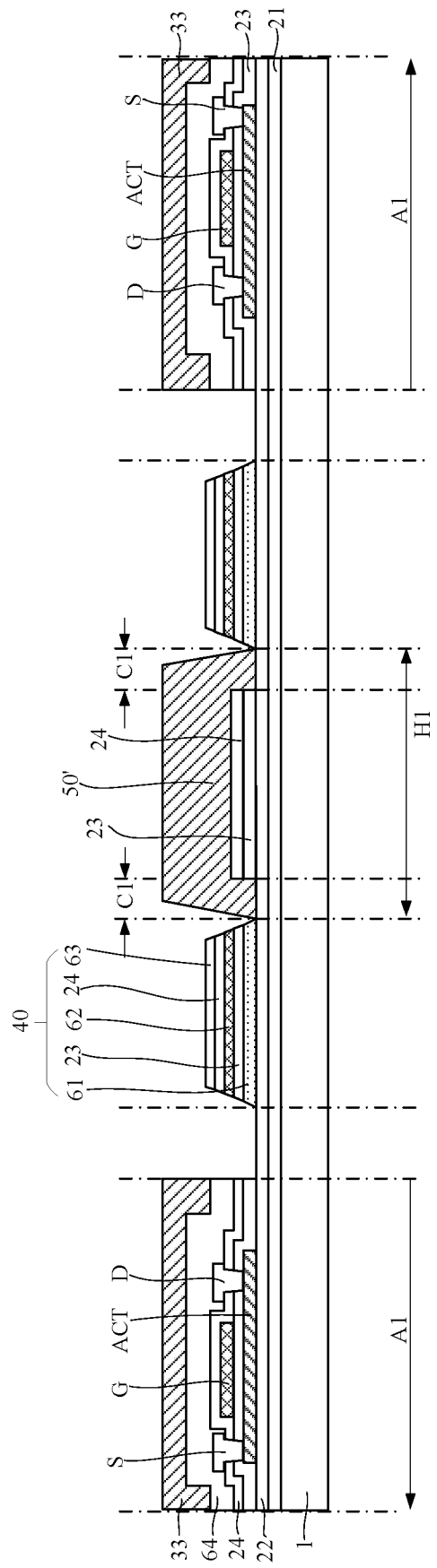

Referring to FIG. 6C, in step S203, the organic material layer 3 is formed on the base substrate 1, and at least a portion of the organic material layer 3 fills the groove 80.

In some exemplary embodiments of the present disclosure, the organic material layer 3 may include a planarization layer 33. Specifically, in step S203, the planarization layer 33 is formed on the side of the first conductive layer away from the base substrate 1. The planarization layer 33 covers the pixel area A1, the hole area H1 and the cutting area C1. In other words, an orthographic projection of a portion of the planarization layer 33 on the base substrate 1 falls within the pixel area A1, and an orthographic projection of the other portion of the planarization layer 33 on the base substrate 1 covers the cutting area C1. Thus, the portion of the planarization layer 33 located in the pixel area A1 may planarize the film layer structure in the pixel area A1, and the portion of the planarization layer 33 located in the hole area H1 may form a filling structure 50'.

Figure 7:
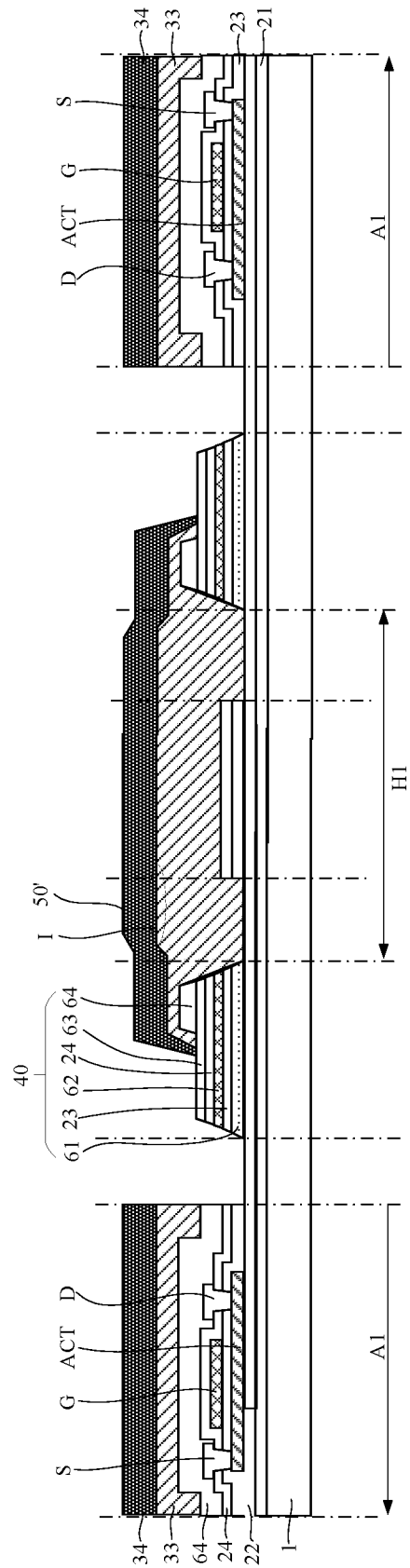
Figure 8:
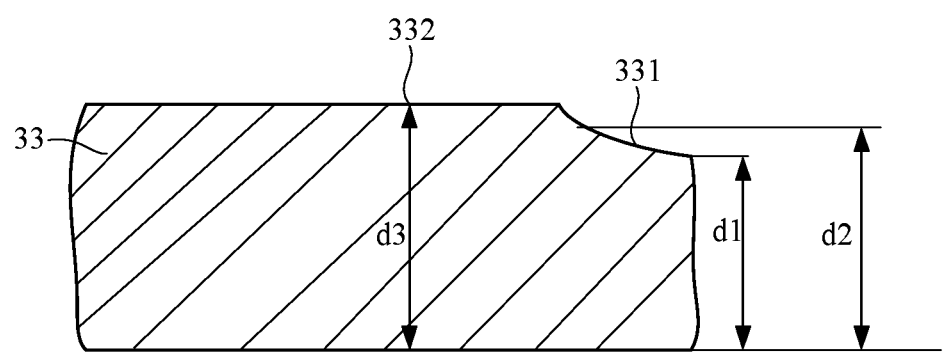
FIG. 8 shows a partial enlarged view of part I in FIG. 7.

In some exemplary embodiments of the present disclosure, referring to FIG. 7, the organic material layer 3 may include a planarization layer 33 and a pixel defining layer 34.

Specifically, in step S201, the first barrier dam 40 may include a stacked layer structure, the stacked layer structure including portions which are respectively located in the first conductive layer 61, the gate insulating layer 23, the second conductive layer 62, the interlayer dielectric layer 24, the third conductive layer 63 and the passivation layer 64.

In step S203, the planarization layer 33 and the pixel defining layer 34 are formed on the side of the first conductive layer away from the base substrate 1. The planarization layer 33 and the pixel defining layer 34 cover the pixel area A1, the hole area H1 and the cutting area C1. In other words, an orthographic projection of a portion of each of the planarization layer 33 and the pixel defining layer 34 on the base substrate 1 falls within the pixel area A1, and an orthographic projection of the other portion of each of the planarization layer 33 and the pixel defining layer 34 on the base substrate 1 covers the cutting area C1. Thus, the portion of the planarization layer 33 and the pixel defining layer 34 located in the pixel area A1 may planarize the film layer structure in the pixel area A1, and the portion of the planarization layer 33 and the pixel defining layer 34 located in the hole area H1 may form a filling structure 50'.

FIG. 8 is a partial enlarged view of part I in FIG. 7. Referring to FIG. 7 and FIG. 8 in combination, the inventor found through research that in step S203, after the planarization layer 33 is formed on the side of the first conductive layer away from the base substrate 1, a portion of the planarization layer 33 fills the groove 80, and a surface of the planarization layer 33 away from the base substrate 1 (the upper surface in FIG. 8) may be a downwardly inclined surface or a downwardly concave curved surface. For example, referring to FIG. 8, for a certain model of product produced in the actual process, a vertical distance d1 between a first surface portion 331 and a reference plane at a first position is about 1256 nanometers, a vertical distance d2 between the first surface portion 331 and the reference plane at a second position is about 1415 nanometers, and a vertical distance d3 between a second surface portion 332 and the reference plane is about 1598 nanometers, in other words, a vertical distance d3 between a second surface portion 332 and the reference plane at a third position is about 1598 nanometers. For example, the reference plane may be an upper surface of the interlayer dielectric layer 24 or the passivation layer 64. In some exemplary embodiments, the reference plane may be the upper surface of the interlayer dielectric layer 24 (that is, the surface away from the base substrate 1), and the first surface portion 331 and the second surface portion 332 are respectively portions of the upper surface of the planarization layers 33, where the first surface portion 331 is a portion of the upper surface of the planarization layer 33 close to the cutting area C1, and the second surface portion 332 is a portion of the upper surface of the planarization layer 33 close to the first barrier dam 40. For example, an orthographic projection of the first surface portion 331 on the base substrate 1 at least partially overlaps an orthographic projection of the cutting area C1 on the base substrate 1, and an orthographic projection of the second surface portion 332 on the base substrate 1 at least partially overlaps an orthographic projection of the first barrier dam 40 on the base substrate 1. For example, the orthographic projection of the first surface portion 331 on the base substrate 1 falls within the orthographic projection of the cutting area C1 on the base substrate 1, and the orthographic projection of the second surface portion 332 on the base substrate 1 falls within the orthographic projection of the first barrier dam 40 on the base substrate 1. Referring to FIG. 8, the first position may be located in the cutting area C1, the second position may be located in an adjoining portion between the cutting area C1 and the first barrier dam 40, and a third position may be located in the area where the first barrier dam 40 is located. That is, an orthographic projection of the first position on the base substrate 1 falls within the orthographic projection of the cutting area C1 on the base substrate 1, an orthographic projection of the second position on the base substrate 1 falls within an orthographic projection of the adjoining portion between the cutting area C1 and the first barrier dam 40 on the base substrate 1, and an orthographic projection of the third position on the base substrate 1 falls within the orthographic projection of the first barrier dam 40 on the base substrate 1. As shown in FIG. 8, the first surface portion 331 is formed as a downwardly inclined surface or a downwardly concave curved surface. For example, the first surface portion 331 may have a slope angle in a range of 10~18 degrees. Optionally, the vertical distance d1 is less than the vertical distance d2. For example, a difference between the vertical distance d2 and the vertical distance d1 may be in a range of 100~300 nanometers. Optionally, the vertical distance d2 is less than the vertical distance d3. For example, a difference between the vertical distance d3 and the vertical distance d2 may be in a range of 150~500 nanometers. Therefore, the flatness of the upper surface of the planarization layer 33 located in the cutting area C1 needs to be further improved.

In the embodiments of the present disclosure, in step S203, a pixel defining layer 34 is further formed on the planarization layer 33, so that an orthographic projection of a portion of the pixel defining layer 34 on the base substrate 1 falls within the pixel area A1, and an orthographic projection of the other portion of the pixel defining layer 34 on the base substrate 1 covers the cutting area C1. With such an arrangement, the flatness of the upper surface of the filling structure 50' may be further improved, which may further ensure that the risk of generation of bubble in the cutting area in the subsequent process of attaching the back film is avoided. That is to say, by providing the stacked layer structure including a plurality of organic material layers in the cutting area, it may be further ensured that the generation of the bubble is avoided, thereby improving the product yield.

In some exemplary embodiments of the present disclosure, the material of the planarization layer 33 and the pixel defining layer 34 includes an organic material, such as at least one of polymethylmethacrylate, polycarbonate, polystyrene, epoxy resin, polyimide and polyethylene.

Optionally, in the embodiments of the present disclosure, the manufacturing method may further include steps of forming various film layers and an encapsulating structure of the OLED device. For example, the various film layers of the OLED device may include an anode layer, a luminescent material layer and a cathode layer. The encapsulating structure may include a stacked layer structure including an inorganic encapsulating layer, an organic encapsulating layer and an inorganic encapsulating layer. The anode layer may be formed on the planarization layer before the pixel defining layer is formed, and the luminescent material layer, the cathode layer and the encapsulating structure may be formed after the pixel defining layer is formed. The embodiments of the present disclosure are not limited to this, and known processes for forming the various film layers and the encapsulating structure of the OLED device may be employed in the embodiments of the present disclosure.

Figure 6D:
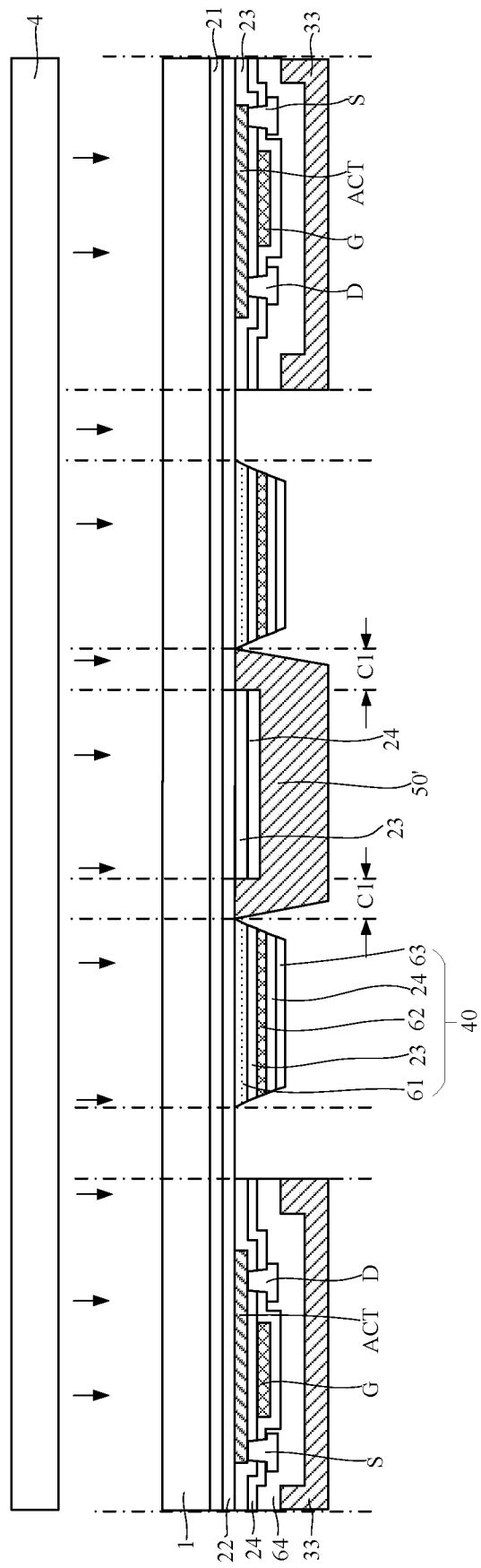
Figure 9:
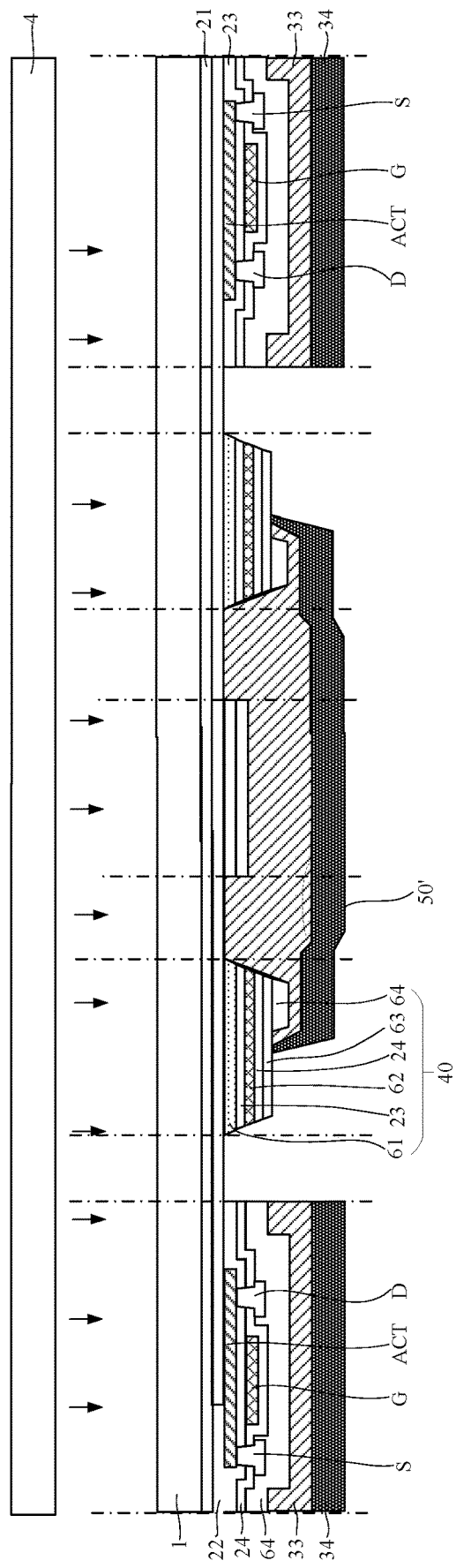

Referring to FIG. 6D and FIG. 9, in step S204, the back film 4 is attached to the surface of the base substrate 1 away from the organic material layer 3.

For example, the back film 4 may include but is not limited to polyimide (PI) material to enhance the strength of the base substrate 1 so as to provide better supporting force for each film layer on the base substrate 1.

Referring to FIG. 6D and FIG. 9, the groove 80 is filled with the organic material layer 3 including the planarization layer 33 or including both the planarization layer 33 and the pixel defining layer 34, so that the thickness of various film layers in the cutting area C1 of the base substrate 1 is relatively large. Thus, in the process of attaching the back film 4 to the base substrate 1, generation of the bubble in the cutting area C1 is avoided. Since the bubble is not generated in the process of attaching the back film, cutting cracks in the film layers in the pixel area and/or separation of the film layers in the pixel area from each other are avoided, thereby improving the product yield.

Figure 6E:
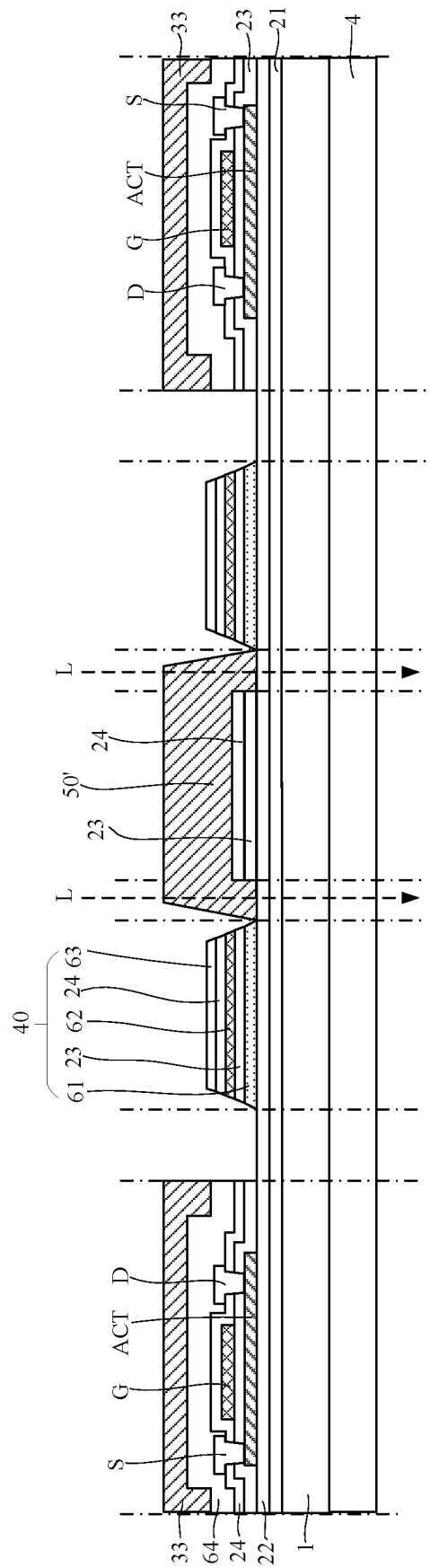
Figure 10:
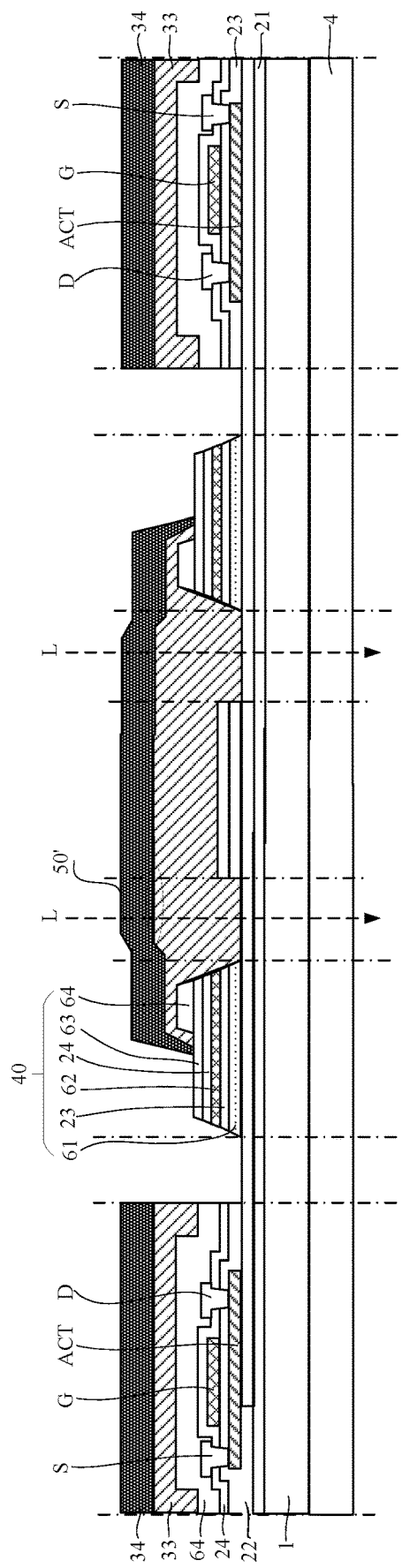

Referring to FIG. 6E and FIG. 10, in step S205, the hole is formed by a cutting process.

For example, with reference to FIG. 1, the hole 10 may be formed by a laser cutting process. Referring to FIG. 6E and FIG. 10, the laser L is projected to the cutting area C1. In order to form a circular hole 10, referring to FIG. 1, the cutting area C1 may be circular. The laser L may move relative to the base substrate 1 to form a circular trace (the dotted line corresponding to the laser L in FIG. 6E schematically represents a portion of the cutting trace), which corresponds to the cutting area C1. In this way, the hole 10 penetrating the back film 4, the base substrate 1 and the film layers thereon may be formed. It should be understood that a portion of the filling structure 50' located outside the cutting trace is retained, forming a structure surrounding the hole 10.

It should be noted that, in the embodiments of the present disclosure, the expression "outside" the cutting trace may indicate a side of the cutting trace close to the pixel area A1.

Since the bubble is not generated in the process of attaching the back film, cutting cracks in the film layers in the pixel area and/or separation of the film layers in the pixel area from each other are avoided in the cutting process, thereby improving the product yield.

It should be noted that some steps in the above method may be executed separately or in combination, and may be executed in parallel or sequentially, and are not limited to the specific operation sequence shown in the drawings.

Some exemplary embodiments of the present disclosure further provide a display substrate. Referring back to FIG. 1, which schematically shows a plan view of the display substrate, the display substrate is manufactured by the manufacturing method according to any one of the above-mentioned embodiments. For example, the display substrate may be an OLED display substrate.

Figure 11:
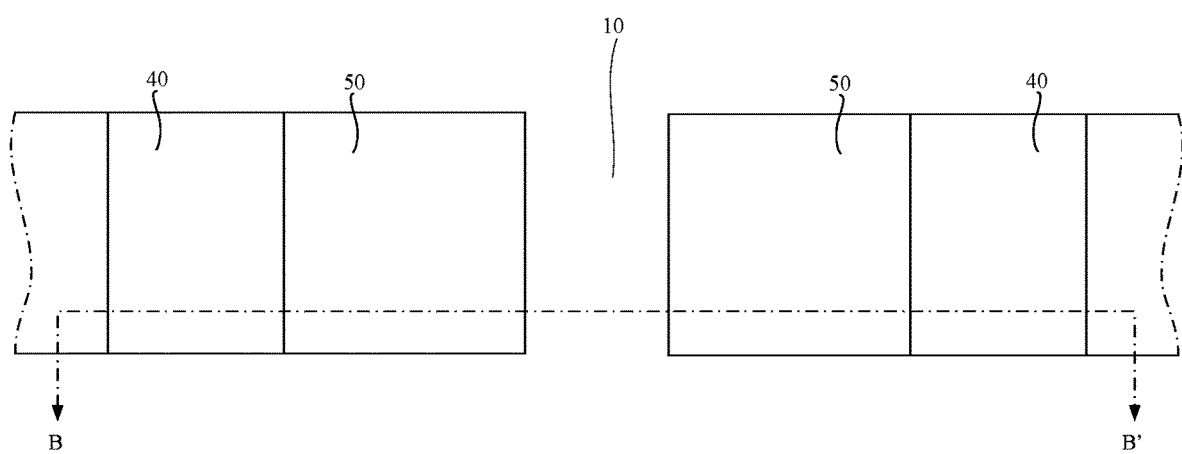
FIG. 11 shows a plan view of a portion of a display substrate according to some exemplary embodiments of the present disclosure around a hole.
Figure 12:
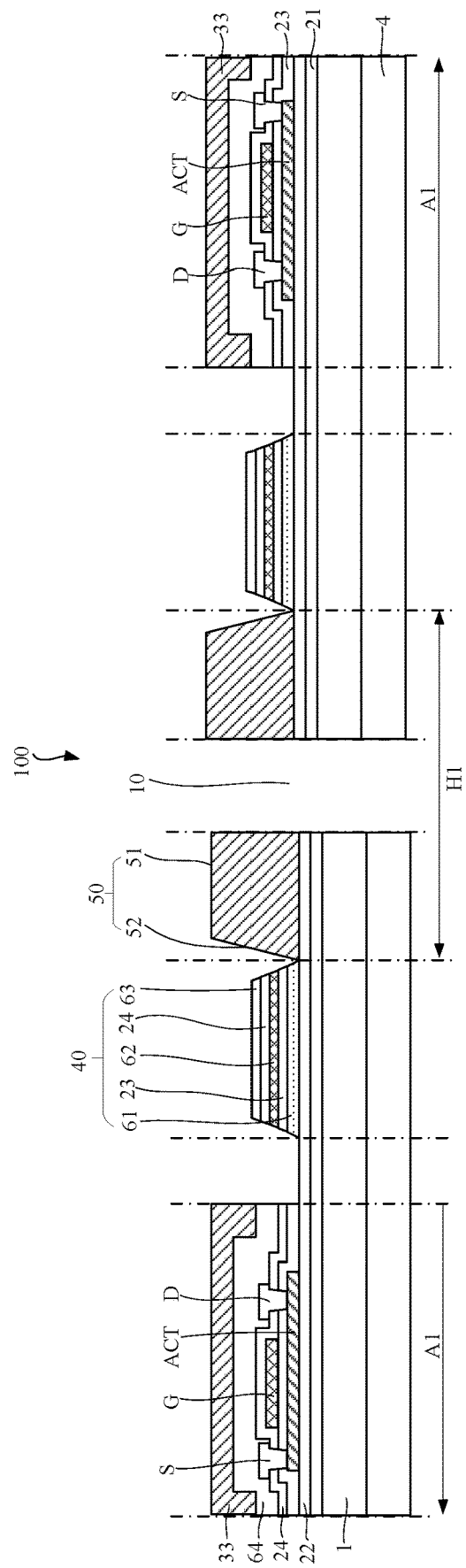
FIG. 12 shows a cross-sectional view of a display substrate according to some exemplary embodiments of the present disclosure taken along line BB' in FIG. 11.
Figure 13:
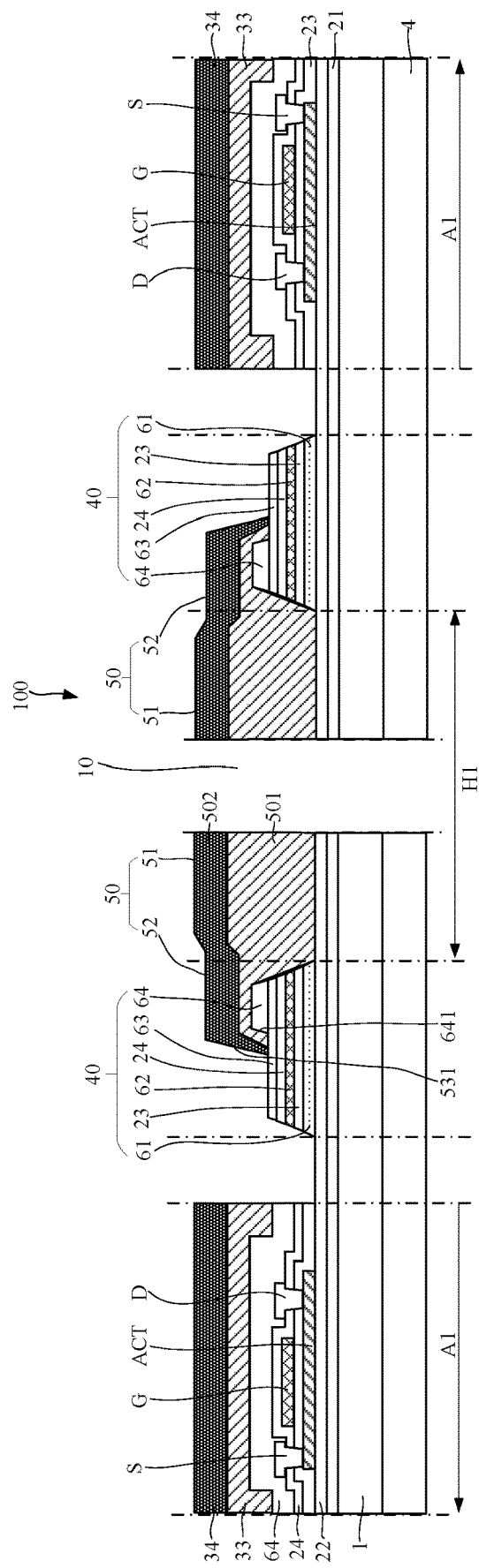
FIG. 13 shows a cross-sectional view of a display substrate according to some other exemplary embodiments of the present disclosure taken along line BB' in FIG. 11.

FIG. 11 shows a plan view of a portion of a display substrate according to some exemplary embodiments of the present disclosure around a hole. FIG. 12 shows a cross-sectional view of a display substrate according to some exemplary embodiments of the present disclosure taken along line BB' in FIG. 11. FIG. 13 shows a cross-sectional view of a display substrate according to some other exemplary embodiments of the present disclosure taken along line BB' in FIG. 11.

Referring to FIG. 1 and FIG. 10 to FIG. 13 in combination, the display substrate 100 may include: a base substrate 1 at least including a pixel area A1 and a hole area H1; a plurality of sub-pixels SP arranged on the base substrate 1, wherein the plurality of sub-pixels SP are located in the pixel area A1; a hole 10 located in the hole area H1; a first barrier dam 40 arranged between the sub-pixels SP and the hole 10 and at least partially surrounding the hole 10; an organic material layer 3, wherein an orthographic projection of the organic material layer 3 on the base substrate 1 falls within the pixel area A1; and a filling structure 50, wherein at least a portion of the filling structure 50 is arranged between the hole 10 and the first barrier dam 40.

As described above, the filling structure 50 and the organic material layer 3 may be formed through the same patterning process. Accordingly, as shown in FIG. 12, the filling structure 50 and the organic material layer 3 are located in the same layer and contain the same material.

Figure 15A:
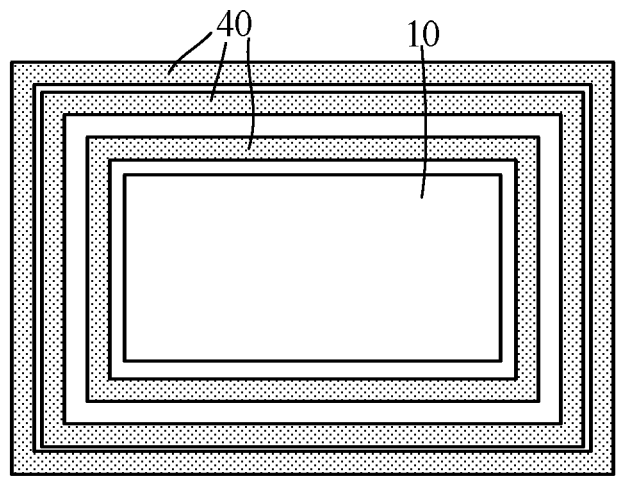
FIGS. 15A and 15B respectively show plan views of a hole and a plurality of first barrier dams included in the display substrate according to some exemplary embodiments of the present disclosure.
Figure 15B:
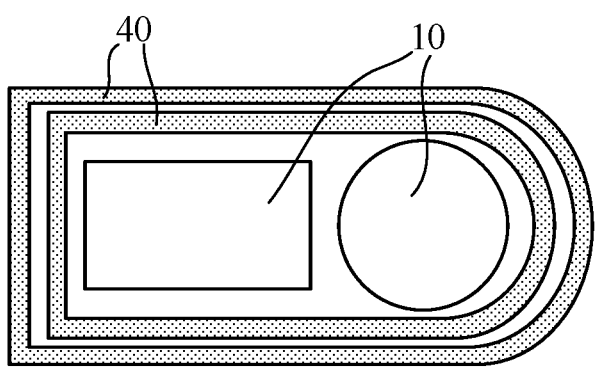

It should be noted that the display substrate 100 may include a plurality of first barrier dams 40 arranged between the sub-pixels SP and the hole 10. Referring to FIG. 15A and FIG. 15B, some exemplary embodiments of the hole 10 and the plurality of first barrier dams 40 are schematically shown. As described above, the orthographic projection of the hole 10 on the base substrate may have various shapes, which include but are not limited to a circle, an oval, a rectangle, a rounded rectangle, a square, a diamond, a trapezoid, and the like. For example, in FIG. 15A, an orthographic projection of the hole 10 on the base substrate is a rectangle, and a plurality of (for example, three) first barrier dams 40 are provided. Optionally, the plurality of first barrier dams 40 may completely surround the hole 10. In FIG. 15B, two holes 10 are provided. The orthographic projection of one of the holes on the base substrate is rectangular, the orthographic projection of the other hole on the base substrate is circular, and a combination of the orthographic projections of the two holes on the base substrate has a racetrack-like shape. A plurality of (for example, two) first barrier dams 40 are provided. Optionally, the plurality of first barrier dams 40 may surround the combination of the two holes.

Optionally, except for one of the first barrier dams closest to the hole 10, the other first barrier dams are not covered with the organic material, that is, the other first barrier dams are not covered by either the organic material layer 3 or the filling structure 50. In this way, the organic material layer 3 and the filling structure 50 are broken in a radial direction of the hole 10.

It should be noted that in the present disclosure, an expression "radial" or "radial direction" may refer to a direction directed from a center of the hole to the sub-pixels SP. For example, when the hole is circular, the center of the hole may be the center of the circle, and when the hole is rectangular, the center of the hole may be an intersection of two diagonal lines.

Optionally, referring to FIG. 12, the filling structure 50 includes a single filling film layer, and the organic material layer 3 includes a planarization layer 33. The filling film layer 50 and the planarization layer 33 are located in the same layer and contain the same material. That is, the filling film layer 50 and the planarization layer 33 are formed by the same patterning process.

Optionally, referring to FIG. 13, the filling structure 50 includes a first filling film layer 501 and a second filling film layer 502, and the organic material layer includes a planarization layer 33 and a pixel defining layer 34. The first filling film layer 501 and the planarization layer 33 are located in the same layer and contain the same material. That is, the filling film layer 501 and the planarization layer 33 are formed by the same patterning process. The second filling film layer 502 and the pixel defining layer 34 are located in the same layer and contain the same material. That is, the second filling film layer 502 and the pixel defining layer 34 are formed by the same patterning process.

For example, the display substrate 100 further includes a functional film layer 6 arranged on a side of the organic material layer 3 close to the base substrate 1. For example, the functional film layer may include: a first conductive layer 61 arranged on the base substrate 1; a gate insulating layer 23 arranged on a side of the first conductive layer 61 away from the base substrate 1; a second conductive layer 62 arranged on a side of the gate insulating layer 23 away from the base substrate 1; an interlayer dielectric layer 24 arranged on a side of the second conductive layer 62 away from the base substrate 1; a third conductive layer 63 arranged on a side of the interlayer dielectric layer 24 away from the base substrate 1; and a passivation layer 64 arranged on a side of the third conductive layer 63 away from the base substrate 1.

Referring to FIGS. 10, 12 and 13 in combination, the gate electrode G of the thin film transistor may be located in the first conductive layer 61. That is, the first conductive layer 61 may be formed of a conductive material forming the gate electrode G. The source electrode S and the drain electrode D of the thin film transistor may be located in the third conductive layer 63. That is, the third conductive layer 63 may be formed of a conductive material forming the source electrode S and the drain electrode D. It should be understood that the second conductive layer 62 may also be formed of a gate conductive material.

For example, in the embodiments shown in FIG. 12, the first barrier dam 40 includes a stacked layer structure, the stacked layer structure including portions which are respectively located in the first conductive layer 61, the gate insulating layer 23, the second conductive layer 62, the interlayer dielectric layer 24 and the third conductive layer 63. In the embodiments shown in FIG. 13, the first barrier dam 40 includes a stacked layer structure, the stacked layer structure including portions which are respectively located in the first conductive layer 61, the gate insulating layer 23, the second conductive layer 62, the interlayer dielectric layer 24, the third conductive layer 63 and the passivation layer 64. By providing the first barrier dam, it is possible to prevent the cracks generated in the cutting process to form the hole from extending to components in the pixel area, so as to avoid affecting the components in the pixel area.

Optionally, a cross section of the first barrier dam 40 parallel to the radial direction of the hole has a trapezoidal shape. Specifically, an orthographic projection of a portion of the passivation layer 64 forming the first barrier dam 40 on the base substrate 1 falls within an orthographic projection of a portion of the third conductive layer 63 forming the first barrier dam 40 on the base substrate 1, the orthographic projection of the portion of the third conductive layer 63 forming the first barrier dam 40 on the base substrate 1 falls within an orthographic projection of a portion of the interlayer dielectric layer 24 forming the first barrier dam 40 on the base substrate 1, the orthographic projection of the portion of the interlayer dielectric layer 24 forming the first barrier dam 40 on the base substrate 1 falls within an orthographic projection of a portion of the second conductive layer 62 forming the first barrier dam 40 on the base substrate 1, the orthographic projection of the portion of the second conductive layer 62 forming the first barrier dam 40 on the base substrate 1 falls within an orthographic projection of a portion of the gate insulating layer 23 forming the first barrier dam 40 on the base substrate 1, and the orthographic projection of the portion of the gate insulating layer 23 forming the first barrier dam 40 on the base substrate 1 falls within an orthographic projection of a portion of the first conductive layer 61 forming the first barrier dam 40 on the base substrate 1.

Optionally, as shown in FIG. 12, an orthographic projection of the filling structure 50 on the base substrate 1 does not overlap an orthographic projection of the first barrier dam 40 on the base substrate 1. That is, the filling structure 50 terminates at a side of the first barrier dam 40 close to the hole 10.

Optionally, as shown in FIG. 13, the passivation layer 64 includes a side portion 641 located on the first barrier dam 40. That is, an orthographic projection of the side portion 641 on the base substrate 1 falls within the orthographic projection of the first barrier dam 40 on the base substrate 1. Optionally, the orthographic projection of the side portion 641 on the base substrate 1 is located approximately in the middle of the orthographic projection of the first barrier dam 40 on the base substrate 1.

The orthographic projection of the filling structure 50 on the base substrate 1 partially overlaps the orthographic projection of the first barrier dam 40 on the base substrate 1. For example, the filling structure 50 includes a side portion 531 close to the first barrier dam 40. An orthographic projection of the side portion 531 on the base substrate 1 falls within the orthographic projection of the first barrier dam 40 on the base substrate 1, and the orthographic projection of the side portion 531 on the base substrate 1 is located in the middle position of the orthographic projection of the first barrier dam 40 on the base substrate 1. That is, the filling structure 50 terminates at the middle position of the upper surface of the first barrier dam 40.

In the illustrated embodiments, the orthographic projection of the filling structure 50 on the base substrate 1 covers an orthographic projection of a portion of the passivation layer 64 forming the first barrier dam 40 on the base substrate 1.

Figure 14A:
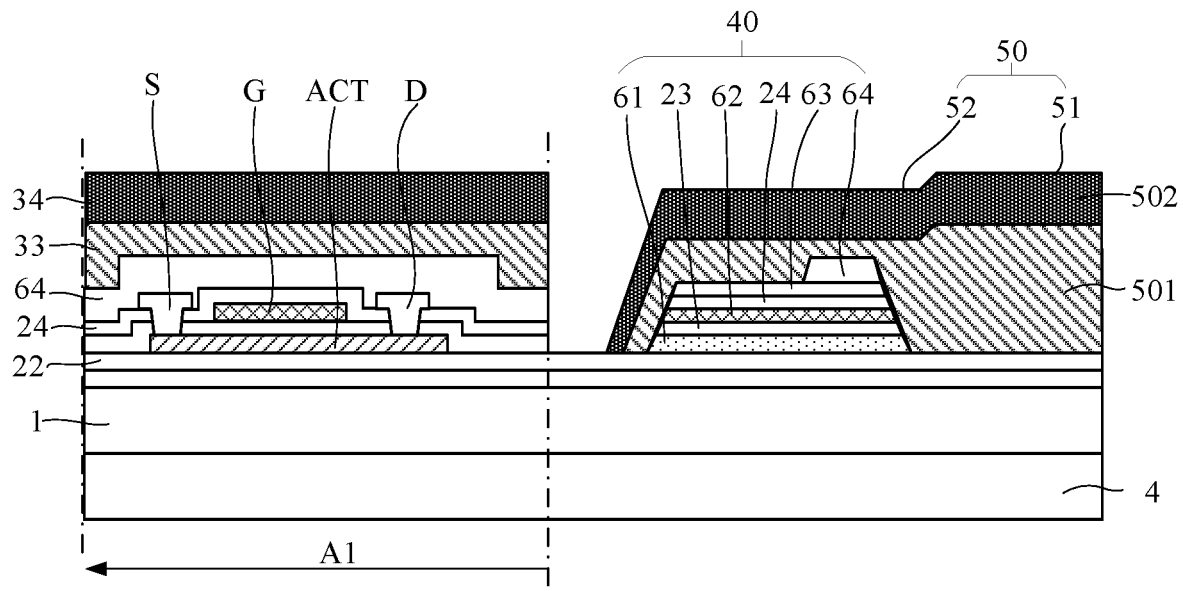
FIGS. 14A and 14B respectively show cross-sectional views of the display substrate according to some other exemplary embodiments of the present disclosure taken along line BB' in FIG. 11, and for clarity, FIGS. 14A and 14B only show a structure on one side of the hole.

Optionally, due to the actual processing technology, the orthographic projection of the filling structure 50 on the base substrate 1 may cover the orthographic projection of the first barrier dam 40 on the base substrate 1, as shown in FIG. 14A. That is, the filling structure 50 may extend to a side of the first barrier dam 40 away from the hole 10.

It should be noted that, in the embodiments shown in FIGS. 12 to 14B, the organic material layer 3 located in the pixel area A1 and the filling structure 50 are disconnected from each other in the radial direction of the hole 10, and they are formed of the same material through the same patterning process.

As shown in FIGS. 12 to 14B, the filling structure 50 may include a first filling portion 51 and a second filling portion 52 that is closer to the first barrier dam 40 than the first filling portion 51. For example, in the embodiments shown in FIG. 12, the first filling portion 51 is a portion of the filling structure 50 close to the hole 10, and the second filling portion 52 is a portion of the filling structure 50 close to the first barrier dam 40. In the embodiments shown in FIG. 13 and FIG. 14A, the first filling portion 51 is a portion of the filling structure 50 close to the hole 10, and the second filling portion 52 is a portion of the filling structure 50 overlapping the first barrier dam 40.

The first filling portion 51 includes a first surface away from the base substrate 1, and the second filling portion 52 includes a second surface away from the base substrate 1. A vertical distance between the first surface and the base substrate 1 is greater than a vertical distance between the second surface and the base substrate 1.

Figure 14B:
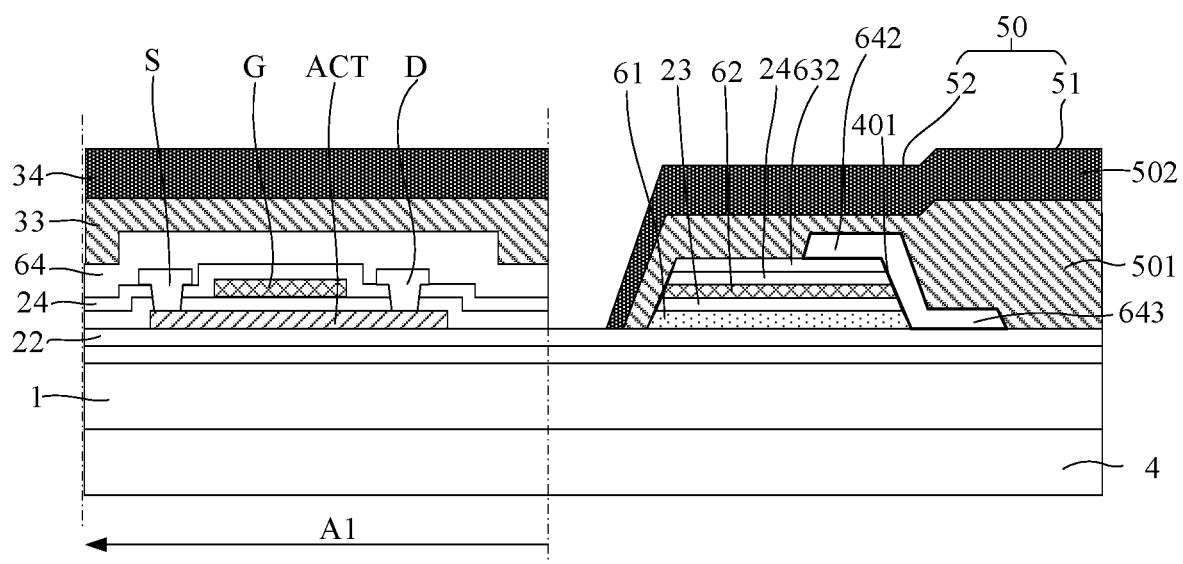

Optionally, as shown in FIG. 14B, the first barrier dam 40 includes a top surface away from the base substrate and a side surface 401 facing the hole, the passivation layer 64 partially covers the top surface of the first barrier dam, and the passivation layer 64 covers the side surface of the first barrier dam. For example, an area of an orthographic projection of a portion of the passivation layer 64 covering the top surface of the first barrier dam (which may be referred to as a first portion of the passivation layer 64 and is denoted by reference numeral 642 in FIG. 14B) on the base substrate is $3/10 \sim 7/10$, such as $2/5 \sim 3/5$, of an area of the orthographic projection of the first portion of the third conductive layer 63 (that is, the portion located in the first barrier dam 40 and denoted by reference numeral 632 in FIG. 14B) on the base substrate. With such an arrangement, the first barrier dam 40 may more effectively prevent cracks from spreading.

As shown in FIG. 14B, the passivation layer 64 further includes a portion that does not cover the first barrier dam 40 (which may be referred to as a second portion of the passivation layer 64 and is denoted by reference numeral 643 in FIG. 14B). An orthographic projection of the second portion 643 on the base substrate 1 overlaps the orthographic projection of the filling structure 50 on the base substrate 1, for example, the second portion is covered by the filling structure 50.

Figure 16:
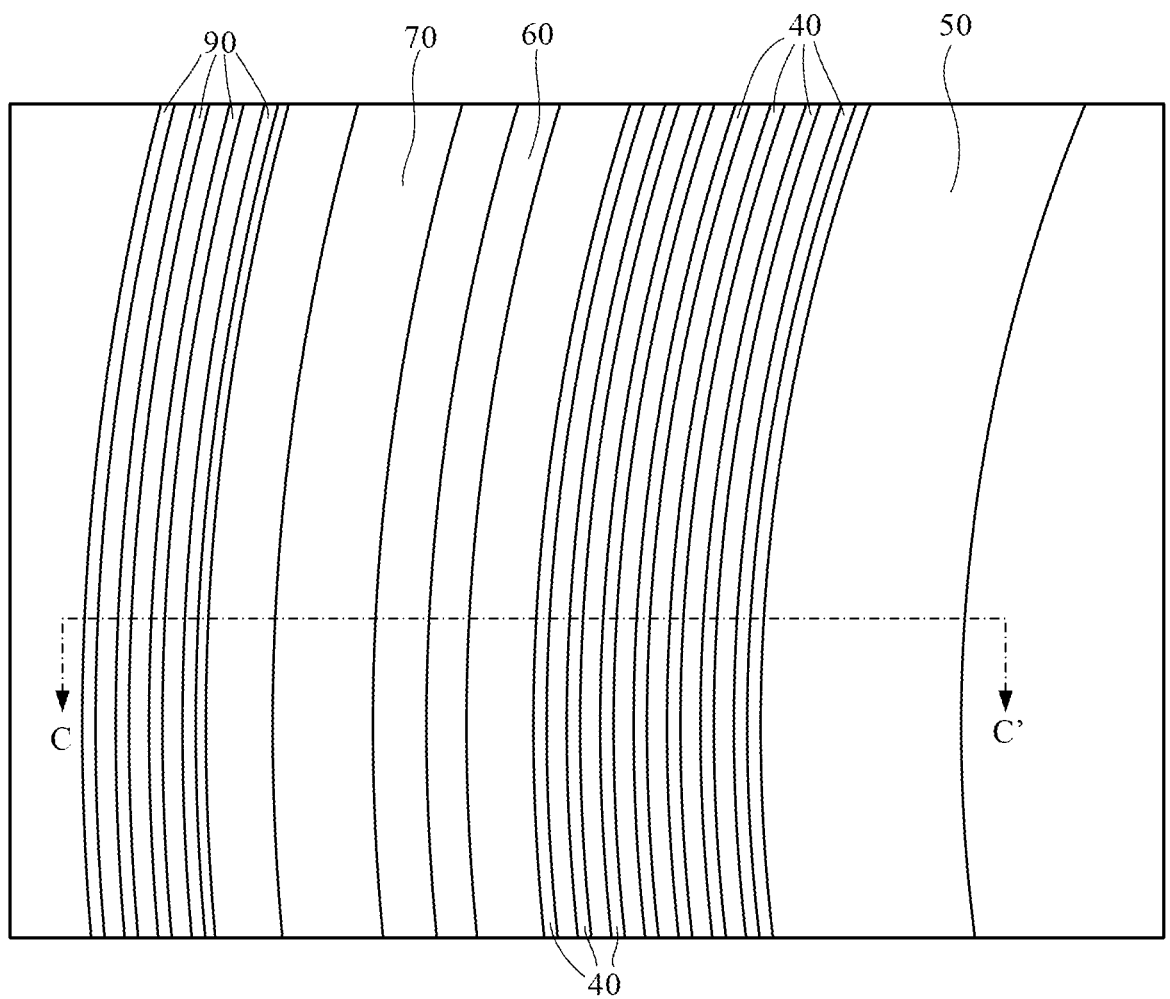
FIG. 16 shows a partial plan view of a portion of the display substrate according to some exemplary embodiments of the present disclosure around the hole.
Figure 17:
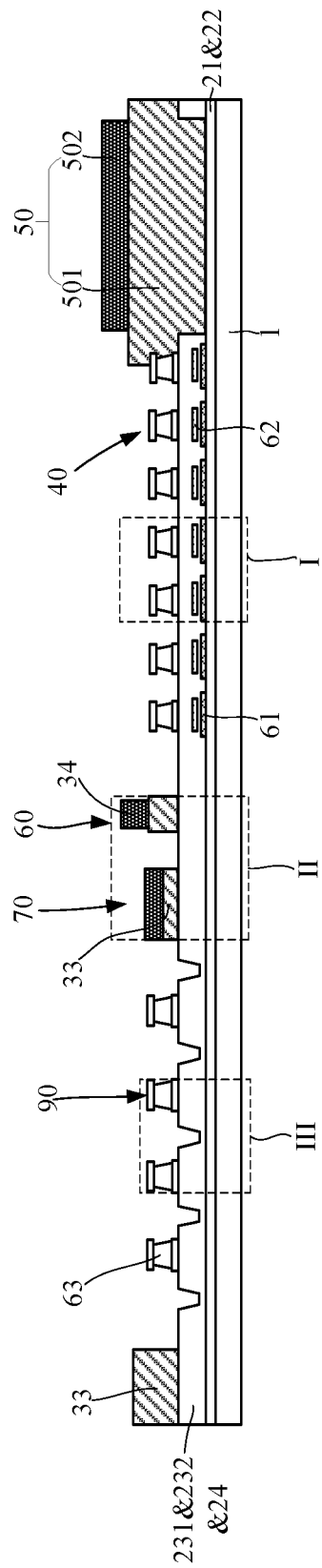
FIG. 17 shows a cross-sectional view of the display substrate according to some exemplary embodiments of the present disclosure taken along line CC' in FIG. 16.
Figure 18:
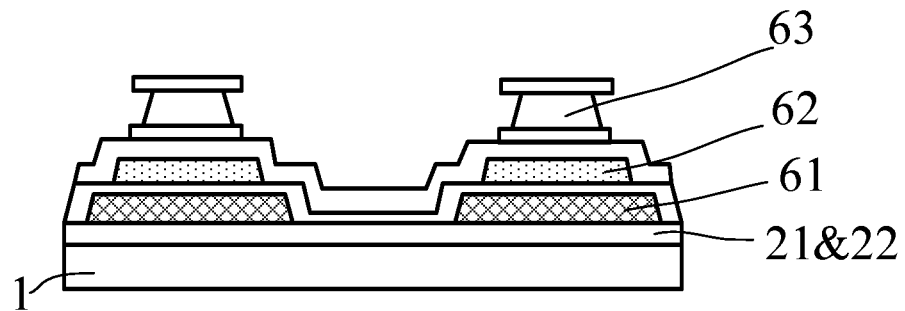
FIG. 18 is a partial enlarged view of part I in FIG. 17.
Figure 19:
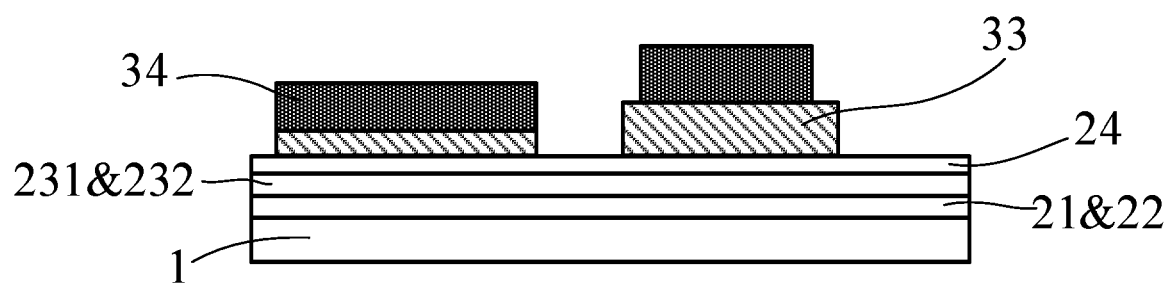
FIG. 19 is a partial enlarged view of part II in FIG. 17.
Figure 20:
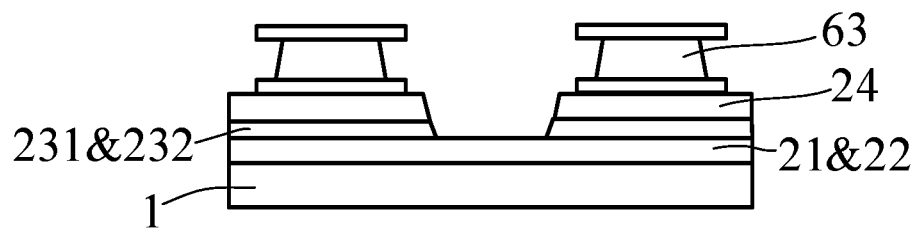
FIG. 20 is a partial enlarged view of part III in FIG. 17.

FIG. 16 shows a partial plan view of a display substrate according to some exemplary embodiments of the present disclosure around a hole. FIG. 17 shows a cross-sectional view of the display substrate according to some exemplary embodiments of the present disclosure taken along line CC' in FIG. 16. FIG. 18 is a partial enlarged view of part I in FIG. 17. FIG. 19 is a partial enlarged view of part II in FIG. 17. FIG. 20 is a partial enlarged view of part III in FIG. 17.

It should be noted that FIGS. 16 and 17 only show the structure on one side of the hole. It should also be noted that the following description focuses on differences between FIGS. 16 to 20 and the above various embodiments. The similarities may be referred to the above description, which will not be repeated here.

Referring to FIGS. 16 to 20, the display substrate 100 may include a plurality of first barrier dams 40, a second barrier dam 60, a third barrier dam 70 and a plurality of fourth barrier dams 90 arranged between the sub-pixels SP and the hole 10. The plurality of first barrier dams 40, the second barrier dam 60, the third barrier dam 70 and the plurality of fourth barrier dams 90 are sequentially arranged in a direction directed from the hole 10 to the sub-pixels SP.

For example, the display substrate 100 may include seven first barrier dams 40, one second barrier dam 60, one third barrier dam 70 and four fourth barrier dams 90. It should be understood that the aforementioned number of barrier dams should not be construed as a limitation to the embodiments of the present disclosure, and the display substrate may include other numbers of various barrier dams.

With continued reference to FIGS. 16 to 20, the display substrate 100 may include a functional film layer arranged on the base substrate 1. For example, the functional film layer may include: a barrier layer 21 arranged on the base substrate 1; a buffer layer 22 arranged on a side of the barrier layer away from the base substrate 1; a first gate insulating layer 231 arranged on a side of the buffer layer away from the base substrate 1; a first conductive layer 61 arranged on a side of the gate insulating layer 231 away from the base substrate 1; a second gate insulating layer 232 arranged on a side of the first conductive layer 61 away from the base substrate 1; a second conductive layer 62 arranged on a side of the second gate insulating layer 232 away from the base substrate 1; an interlayer dielectric layer 24 arranged on a side of the second conductive layer 62 away from the base substrate 1; and a third conductive layer 63 arranged on a side of the interlayer dielectric layer 24 away from the base substrate 1.

Referring to FIGS. 10, 12 and 13 in combination, the gate electrode G of the thin film transistor may be located in the first conductive layer 61. That is, the first conductive layer 61 may be formed of a conductive material forming the gate electrode G. The source electrode S and the drain electrode D of the thin film transistor may be located in the third conductive layer 63. That is, the third conductive layer 63 may be formed of a conductive material forming the source electrode S and the drain electrode D. It should be understood that the second conductive layer 62 may also be formed of a gate conductive material.

With continued reference to FIGS. 16 to 20, the display substrate 100 may include an organic material layer 3 arranged on a side of the functional film layer away from the base substrate 1. For example, the organic material layer 3 may include at least one layer selected from a planarization layer 33 and a pixel defining layer 34.

In the embodiments shown in FIGS. 16 to 20, the first barrier dam includes at least a stacked layer structure, the stacked layer structure including portions which are respectively located in the barrier layer 21, the buffer layer 22 and the third conductive layer 62. For example, the first barrier dam 40 includes a stacked layer structure, the stacked layer structure including portions which are respectively located in the barrier layer 21, the buffer layer 22, the first gate insulating layer 231, the first conductive layer 61, the second gate insulating layer 232, the second conductive layer 62, the interlayer dielectric layer 24 and the third conductive layer 63.

The second barrier dam 60 includes at least a stacked layer structure, the stacked layer structure including portions which are respectively located in the planarization layer 33 and the pixel defining layer 34. For example, the second barrier dam 60 includes a stacked layer structure, the stacked layer structure including portions which are respectively located in the barrier layer 21, the buffer layer 22, the first gate insulating layer 231, the second gate insulating layer 232, the interlayer dielectric layer 24, the planarization layer 33 and the pixel defining layer 34.

The third barrier dam 70 includes at least a stacked layer structure, the stacked layer structure including portions which are respectively located in the planarization layer 33 and the pixel defining layer 34. For example, the third barrier dam 70 includes a stacked layer structure, the stacked layer structure including portions which are respectively located in the barrier layer 21, the buffer layer 22, the first gate insulating layer 231, the second gate insulating layer 232, the interlayer dielectric layer 24, the planarization layer 33 and the pixel defining layer 34.

The fourth barrier dam 90 includes at least a stacked layer structure, the stacked layer structure including portions which are respectively located in the barrier layer 21, the buffer layer 22 and the third conductive layer 62. For example, the fourth barrier dam 90 includes a stacked layer structure, the stacked layer structure including portions which are respectively located in the barrier layer 21, the buffer layer 22, the first gate insulating layer 231, the second gate insulating layer 232, the interlayer dielectric layer 24 and the third conductive layer 63.

Further, the display substrate 100 may further include a filling structure 50. For example, the filling structure 50 includes a first filling film layer 501 and a second filling film layer 502, and the organic material layer includes a planarization layer 33 and a pixel defining layer 34. The first filling film layer 501 and the planarization layer 33 are located in the same layer and contain the same material. That is, the filling film layer 501 and the planarization layer 33 are formed by the same patterning process. The second filling film layer 502 and the pixel defining layer 34 are located in the same layer and contain the same material. That is, the second filling film layer 502 and the pixel defining layer 34 are formed by the same patterning process.

Referring to FIG. 17, except for one of the first barrier dams 40 closest to the hole 10, the other first barrier dams 40 are not covered with the organic material, that is, the other first barrier dams 40 are not covered by either the organic material layer 3 or the filling structure 50. In other words, orthographic projections of first barrier dams other than the first barrier dam closest to the hole on the base substrate are spaced apart from the orthographic projection of the filling structure 50 on the base substrate. In this way, the organic material layer 3 and the filling structure 50 are broken in a radial direction of the hole 10.

The orthographic projection of the filling structure 50 on the base substrate 1 partially overlaps the orthographic projection of the first barrier dam 40 closest to the hole 10 on the base substrate 1. For example, the filling structure 50 terminates at the middle position of the upper surface of the first barrier dam 40 closest to the hole 10.

Optionally, the orthographic projection of the filling structure 50 on the base substrate 1 partially overlaps the orthographic projection of the first barrier dam 40 on the base substrate 1, and an area of an overlapping portion is about ½, for example, in a range of ⅖~⅗ of an area of the orthographic projection of the first barrier dam 40 on the base substrate 1. With such an arrangement, the flatness of the filling structure may be improved.

The orthographic projection of the first barrier dam 40 on the base substrate 1 in the radial direction of the hole 10 has a dimension smaller than that of the orthographic projection of each of the second barrier dam 60 and the third barrier dam 70 on the base substrate 1 in the radial direction of the hole 10. The dimension of the orthographic projection of the first barrier dam 40 on the base substrate 1 in the radial direction of the hole 10 is substantially equal to that of the orthographic projection of the fourth barrier dam 90 on the base substrate 1 in the radial direction of the hole 10. Referring to FIGS. 17 to 20, the first barrier dam 40 has a width smaller than that of each of the second barrier dam 60 and the third barrier dam 70, and substantially equal to that of the fourth barrier dam 90.

It should be noted that in the present disclosure, unless otherwise specified, the width of the barrier dam represents the dimension of the orthographic projection of the barrier dam on the base substrate in the radial direction of the hole.

For example, the dimension (that is, the width) of the orthographic projection of each of the first barrier dam 40 and the fourth barrier dam 90 on the base substrate 1 in the radial direction of the hole 10 is in a range of about 5~7 microns, the dimension (that is, the width) of the orthographic projection of the second barrier dam 60 on the base substrate 1 in the radial direction of the hole 10 is in a range of about 16~20 microns, and the dimension (that is, the width) of the orthographic projection of the third barrier dam 70 on the base substrate 1 in the radial direction of the hole 10 is about 40 microns.

Optionally, the plurality of first barrier dams 40 are arranged at equal intervals in the radial direction of the hole 10. A width of a portion of the first barrier dam 40 located in the third conductive layer 63 is smaller than a width of a portion of the first barrier dam 40 located in the second conductive layer 62, and the width of the portion of the first barrier dam located in the second conductive layer 62 is smaller than a width of a portion of the first barrier dam 40 located in the first conductive layer 61.

For example, the width of the portion of the first barrier dam 40 located in the third conductive layer 63 is about 5 microns, the width of the portion of the first barrier dam 40 located in the second conductive layer 62 is about 6 microns, and the width of the portion of the first barrier dam 40 located in the first conductive layer 61 is about 7 microns.

For another example, the interval between the portions of two adjacent first barrier dams 40 located in the third conductive layer 63 is about 7 microns.

Optionally, the plurality of fourth barrier dams 90 are arranged at equal intervals in the radial direction of the hole 10. The interval between two adjacent fourth barrier dams 90 is smaller than the interval between two adjacent first barrier dams 40.

For example, the width of the portion of the fourth barrier dam 90 located in the third conductive layer 63 is about 5 microns.

For another example, the interval between the portions of two adjacent fourth barrier dams 90 located in the third conductive layer 63 is about 9 microns, and the interval between the portions of two adjacent fourth barrier dams 90 located in the first gate insulating layer 231 is about 5 microns.

For example, a portion of the second barrier dam 60 located in the pixel defining layer 34 has a width of about 16 microns, and a portion of the second barrier dam 60 located in the planarization layer 33 has a width of about 20 microns.

For example, a portion of the third barrier dam 70 located in the pixel defining layer 34 has a width of about 40 microns, and a portion of the third barrier dam 70 located in the planarization layer 33 has a width of about 40 microns.

For another example, an interval between the portion of the second barrier dam 60 located in the planarization layer 33 and the portion of the third barrier dam 70 located in the planarization layer 33 is about 20 microns.

In some exemplary embodiments of the present disclosure, a cross section of each of the first barrier dams 40 and the second barrier dam 60 is trapezoidal, wherein the cross section is perpendicular to a surface of the base substrate where the first barrier dam and the second barrier dam are arranged (that is, the upper surface shown in FIG. 6A), and the cross section extends in a first direction (that is, the above-mentioned radial direction). A smallest dimension of the width of the first barrier dam 40 is ¼~⅜ of that of the second barrier dam 60, and a largest dimension of the width of the first barrier dam 40 is ³⁄₁₀~⅖ of that of the second barrier dam 60. With such an arrangement, the first barrier dam and the second barrier dam may cooperate with each other to more effectively prevent the cracks from spreading.

A cross section of each of the first barrier dam and the third barrier dam is trapezoidal, wherein the cross section is perpendicular to a surface of the base substrate where the first barrier dam and the third barrier dam are arranged, and the cross section extends in the first direction. The smallest dimension of the width of the first barrier dam 40 is $1/16 \sim 3/16$ of that of the third barrier dam 70, and the largest dimension of the width of the first barrier dam 40 is $3/20 \sim 1/5$ of that of the third barrier dam 70. With such an arrangement, the first barrier dam and the third barrier dam may cooperate with each other to more effectively prevent the cracks from spreading.

Figure 21:
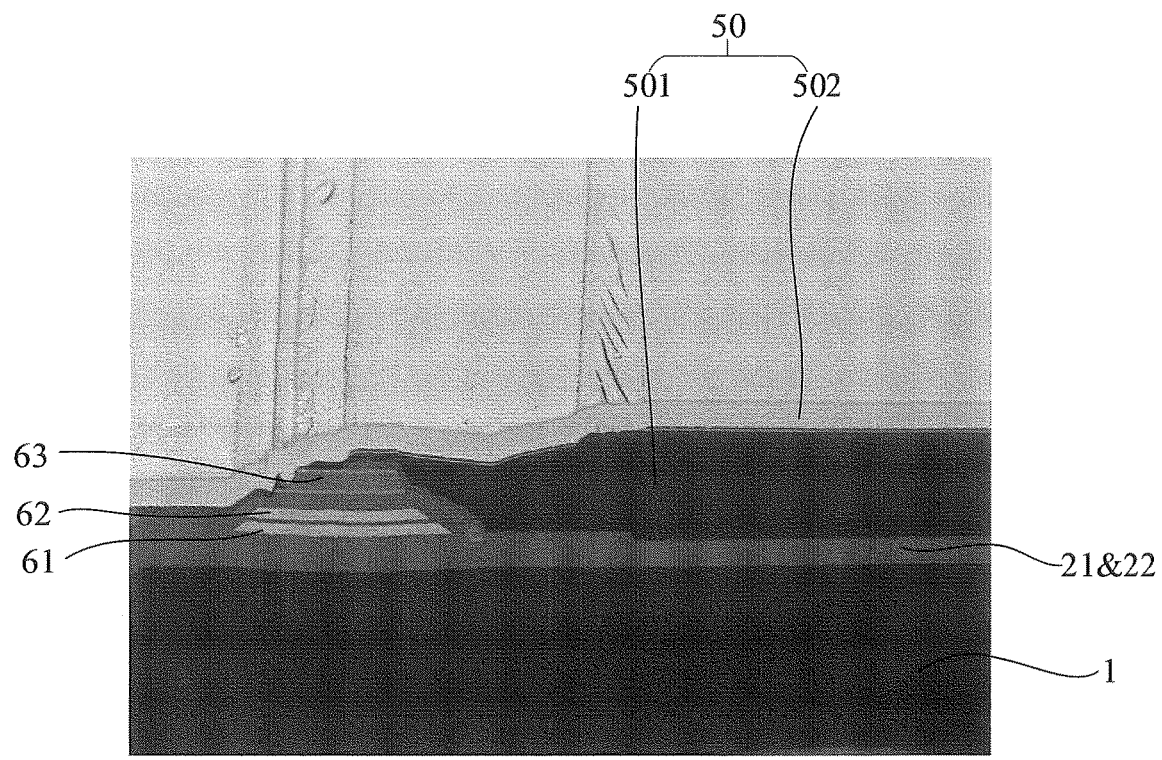
FIG. 21 shows a FIB (focused ion beam) diagram of a display substrate according to some exemplary embodiments of the present disclosure.
Figure 22:
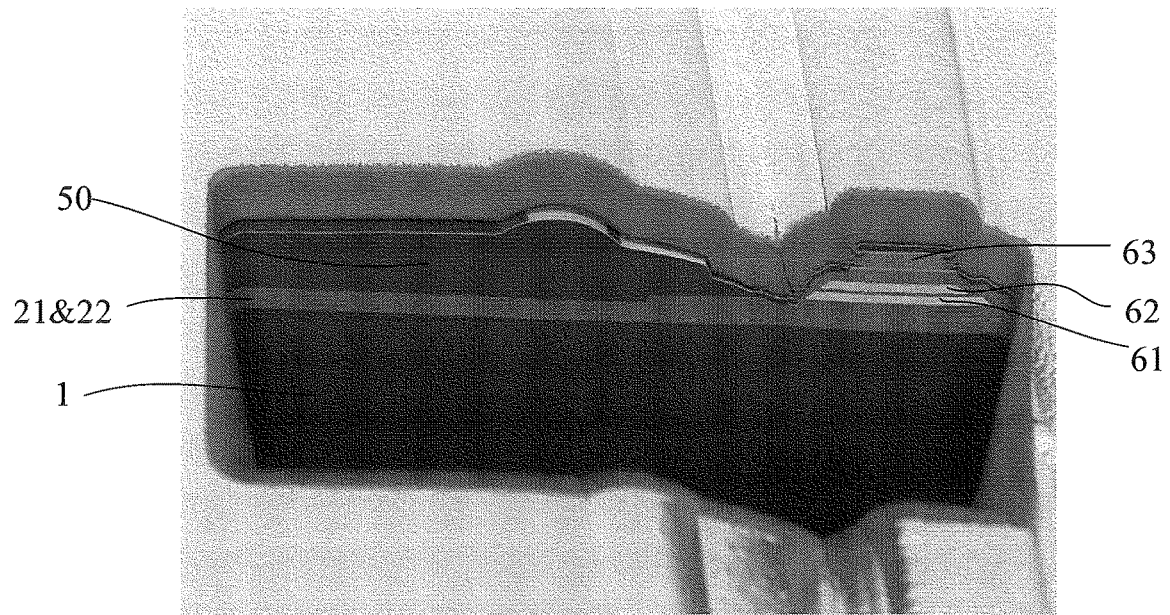
FIG. 22 shows a FIB (focused ion beam) diagram of a display substrate according to some exemplary embodiments of the present disclosure.

FIG. 21 shows a FIB (focused ion beam) diagram of a display substrate according to some exemplary embodiments of the present disclosure. As shown in FIG. 21, the filling structure 50 includes two film layers 501 and 502. As described above, the film layers 501 and 502 correspond to the planarization layer and the pixel defining layer, respectively. FIG. 22 shows a FIB (focused ion beam) diagram of a display substrate according to some exemplary embodiments of the present disclosure. As shown in FIG. 22, the filling structure 50 includes one film layer. As described above, the film layer corresponds to the planarization layer.

For example, the material of the organic material layer and the filling structure 50 includes at least one selected from polymethylmethacrylate, polycarbonate, polystyrene, epoxy resin, polyimide and polyethylene.

Optionally, the display substrate 100 further includes a back film 4 arranged on the surface of the base substrate 1 away from the organic material layer 3. For example, the back film 4 may include but is not limited to polyimide (PI) material to enhance the strength of the base substrate 1 so as to provide better supporting force for various film layers on the base substrate 1.

Figure 23:
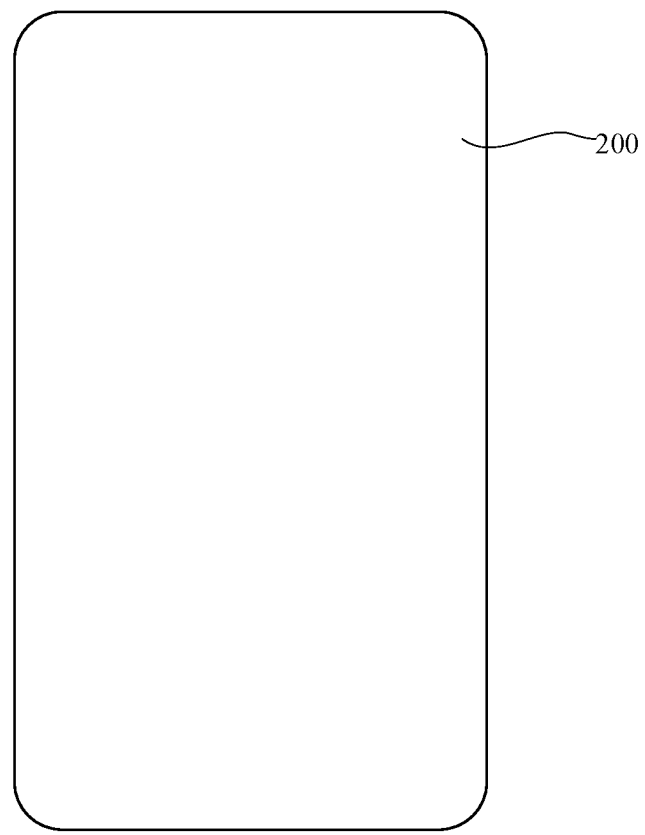
FIG. 23 shows a schematic structural view of a display device according to some exemplary embodiments of the present disclosure.

Some exemplary embodiments of the present disclosure further provide a display device 200. FIG. 23 shows a schematic structural view of a display device according to some exemplary embodiments of the present disclosure. As shown in FIG. 23, the display device includes the display substrate according to the above-mentioned embodiments.

It should be understood that the display substrate and the display device also have technical effects corresponding to the beneficial effects of the above-mentioned manufacturing method. For details, please refer to the foregoing description.

The display device may be any product or component with a display function. For example, the display device may be a smart phone, a portable phone, a navigation device, a television (TV), a vehicle stereo, a laptop computer, a tablet computer, a portable multimedia player (PMP), a personal digital assistant (PDA), and so on. The display device may be a pocket-sized portable communication terminal configured to have a wireless communication function. Moreover, the display device may be a flexible device or a flexible display device.

Although some embodiments of the general technical concept of the present disclosure have been illustrated and described, it should be understood by those skilled in the art that these embodiments may be modified without departing from the principle and spirit of the general technical concept of the present disclosure. The scope of the present disclosure shall be defined by the claims and their equivalents.

What is claimed is:
1. A display substrate, comprising:
   a base substrate at least comprising a pixel area and a hole area;
   a plurality of sub-pixels on the base substrate, wherein the plurality of sub-pixels are located in the pixel area;
   a hole in the hole area;
   a first barrier dam arranged between the sub-pixels and the hole and at least partially surrounding the hole;
   a second barrier dam on a side of the first barrier dam away from the hole;
   an organic material layer comprising at least one film layer, wherein an orthographic projection of the organic material layer on the base substrate falls within the pixel area;
   a filling structure, wherein at least a portion of the filling structure is arranged between the hole and the first barrier dam; and
   a functional film layer arranged on a side of the organic material layer close to the base substrate,
   wherein the filling structure and the at least one film layer of the organic material layer are located in the same layer and comprise the same material;
   wherein an orthographic projection of the first barrier dam on the base substrate has a width smaller than that of an orthographic projection of the second barrier dam on the base substrate;
   wherein the functional film layer comprises:
      a first conductive layer on the base substrate;
      a gate insulating layer on a side of the first conductive layer away from the base substrate;
      a second conductive layer on a side of the gate insulating layer away from the base substrate;
      an interlayer dielectric layer on a side of the second conductive layer away from the base substrate;
      a third conductive layer on a side of the interlayer dielectric layer away from the base substrate; and
      a passivation layer on a side of the third conductive layer away from the base substrate; and
   wherein the first barrier dam comprises a stacked layer structure, the stacked layer structure comprising portions which are respectively located in the first conductive layer, the gate insulating layer, the second conductive layer, the interlayer dielectric layer, the third conductive layer and the passivation layer; and the passivation layer comprises a first portion located in the first barrier dam, the third conductive layer comprises a first portion located in the first barrier dam, and an orthographic projection of the first portion of the passivation layer on the base substrate falls within an orthographic projection of the first portion of the third conductive layer on the base substrate.

2. The display substrate according to claim 1, wherein the filling structure comprises a single filling film layer, and the organic material layer comprises a planarization layer; and
   the single filling film layer and the planarization layer are located in the same layer and comprise the same material.

3. The display substrate according to claim 1, wherein the filling structure comprises a first filling film layer and a second filling film layer, and the organic material layer comprises a planarization layer and a pixel defining layer;
   the first filling film layer and the planarization layer are located in the same layer and comprise the same material; and
   the second filling film layer and the pixel defining layer are located in the same layer and comprise the same material.

4. The display substrate according to claim 1, wherein the filling structure comprises a first filling portion and a second filling portion that is closer to the first barrier dam than the first filling portion;
the first filling portion comprises a first surface away from the base substrate, and the second filling portion comprises a second surface away from the base substrate; and
a vertical distance between the first surface and the base substrate is greater than a vertical distance between the second surface and the base substrate.

5. The display substrate according to claim 1, wherein a cross section of each of the first barrier dam and the second barrier dam is trapezoidal, the cross section is perpendicular to a surface of the base substrate where the first barrier dam and the second barrier dam are arranged, and the cross section extends in a first direction directed from the hole area to the pixel area; and
wherein a smallest dimension of a width of the first barrier dam is $1/4 \sim 3/8$ of that of the second barrier dam, and a largest dimension of the width of the first barrier dam is $3/10 \sim 2/5$ of that of the second barrier dam.

6. The display substrate according to claim 1, wherein a material of the organic material layer comprises at least one selected from polymethylmethacrylate, polycarbonate, polystyrene, epoxy resin, polyimide and polyethylene; and/or,
wherein the base substrate is a flexible base substrate, and the display substrate further comprises a back film arranged on a surface of the base substrate away from the organic material layer.

7. A display device comprising the display substrate according to claim 1.

8. The display substrate according to claim 1, wherein the display substrate comprises a plurality of first barrier dams, and an orthographic projection of one of the plurality of first barrier dams closest to the hole on the base substrate does not overlap an orthographic projection of the filling structure on the base substrate; or,
wherein the display substrate comprises a plurality of first barrier dams, and an orthographic projection of one of the plurality of first barrier dams closest to the hole on the base substrate partially overlaps an orthographic projection of the filling structure on the base substrate; or,
wherein the display substrate comprises a plurality of first barrier dams, and an orthographic projection of the filling structure on the base substrate covers an orthographic projection of one of the plurality of first barrier dams closest to the hole on the base substrate.

9. The display substrate according to claim 8, wherein an orthographic projection of the filling structure on the base substrate covers the orthographic projection of the first portion of the passivation layer on the base substrate.

10. The display substrate according to claim 1, wherein orthographic projections of first barrier dams other than the first barrier dam closest to the hole on the base substrate are spaced apart from the orthographic projection of the filling structure on the base substrate.

11. The display substrate according to claim 10, wherein the orthographic projection of the filling structure on the base substrate partially overlaps the orthographic projection of the first barrier dam on the base substrate, and an area of an overlapping portion is $2/5 \sim 3/5$ of an area of the orthographic projection of the first barrier dam on the base substrate.

12. The display substrate according to claim 11, wherein the first barrier dam comprises a top surface away from the base substrate and a side surface facing the hole, the passivation layer partially covers the top surface of the first barrier dam, and the passivation layer covers the side surface of the first barrier dam.

13. The display substrate according to claim 12, wherein an area of an orthographic projection of a portion of the passivation layer covering the top surface of the first barrier dam on the base substrate is $3/10 \sim 7/10$ of an area of the orthographic projection of the first portion of the third conductive layer on the base substrate.

14. The display substrate according to claim 1, further comprising a third barrier dam on a side of the second barrier dam away from the hole, wherein an orthographic projection of the third barrier dam on the base substrate has a width greater than that of the orthographic projection of the second barrier dam on the base substrate.

15. The display substrate according to claim 14, wherein a cross section of each of the first barrier dam and the third barrier dam is trapezoidal, the cross section is perpendicular to a surface of the base substrate where the first barrier dam and the third barrier dam are arranged, and the cross section extends in a first direction directed from the hole area to the pixel area; and
wherein a smallest dimension of a width of the first barrier dam is $1/16 \sim 3/16$ of that of the third barrier dam, and a largest dimension of the width of the first barrier dam is $3/20 \sim 1/5$ of that of the third barrier dam.

16. The display substrate according to claim 14, further comprising a fourth barrier dam on a side of the third barrier dam away from the hole, wherein an orthographic projection of the fourth barrier dam on the base substrate has a width substantially equal to that of the orthographic projection of the first barrier dam on the base substrate.

17. The display substrate according to claim 16, further comprising a functional film layer on a side of the organic material layer close to the base substrate, wherein the functional film layer comprises:
a barrier layer on the base substrate;
a buffer layer on a side of the barrier layer away from the base substrate;
a first gate insulating layer on a side of the buffer layer away from the base substrate;
a first conductive layer on a side of the first gate insulating layer away from the base substrate;
a second gate insulating layer on a side of the first conductive layer away from the base substrate;
a second conductive layer on a side of the second gate insulating layer away from the base substrate;
an interlayer dielectric layer on a side of the second conductive layer away from the base substrate; and
a third conductive layer on a side of the interlayer dielectric layer away from the base substrate.

18. The display substrate according to claim 17, wherein the filling structure further comprises a portion located in at least one of the barrier layer and the buffer layer.

19. The display substrate according to claim 18, wherein the first barrier dam comprises at least a stacked layer structure, the stacked layer structure comprising portions which are respectively located in the barrier layer, the buffer layer and the third conductive layer; and/or
wherein the second barrier dam comprises at least a stacked layer structure, the stacked layer structure comprising portions which are respectively located in the planarization layer and the pixel defining layer; and/or
wherein the third barrier dam comprises at least a stacked layer structure, the stacked layer structure comprising portions which are respectively located in the planarization layer and the pixel defining layer; and/or wherein the fourth barrier dam comprises at least a stacked layer structure, the stacked layer structure comprising portions which are respectively located in the barrier layer, the buffer layer and the third conductive layer.

20. A manufacturing method of a display substrate, comprising steps of:

providing a base substrate comprising at least a pixel area and a cutting area;

forming a functional film layer comprising at least an inorganic material layer on the base substrate, wherein an orthographic projection of a portion of the inorganic material layer on the base substrate falls within the pixel area, and an orthographic projection of the other portion of the inorganic material layer on the base substrate covers the cutting area;

removing at least a portion of the inorganic material layer in the cutting area so as to form a groove in the cutting area of the base substrate;

forming an organic material layer on the base substrate;

attaching a back film to a surface of the base substrate away from the functional film layer and the organic material layer; and performing a cutting process to form a hole, wherein, in the cutting process, a cutting line is located in the cutting area, wherein the step of forming an organic material layer on the base substrate comprises:

forming the organic material layer on a side of the functional film layer away from the base substrate, so that an orthographic projection of a portion of the organic material layer on the base substrate falls within the pixel area, and an orthographic projection of the other portion of the organic material layer on the base substrate covers the cutting area, thereby the other portion of the organic material layer forms a filling structure for filling the groove.

21. The manufacturing method according to claim 20, wherein, in the step of attaching a back film to a surface of the base substrate away from the functional film layer and the organic material layer, pressure is applied to attach the back film to the base substrate such that a portion of the base substrate located in the cutting area and a portion of the base substrate located in the pixel area both attach to the back film.

22. The manufacturing method according to claim 20, wherein the step of performing a cutting process to form a hole comprises:

performing a laser cutting process so that a track projected by a laser on the base substrate falls within the groove to form a hole penetrating the back film, the base substrate, the functional film layer and the filling structure.

23. The manufacturing method according to claim 20, further comprising forming a first barrier dam on the base substrate, wherein the first barrier dam surrounds the cutting area.

24. The manufacturing method according to claim 23, wherein an orthographic projection of the filling structure on the base substrate does not overlap an orthographic projection of the first barrier dam on the base substrate; or, wherein an orthographic projection of the filling structure on the base substrate partially overlaps an orthographic projection of the first barrier dam on the base substrate; or, wherein an orthographic projection of the filling structure on the base substrate covers an orthographic projection of the first barrier dam on the base substrate.

25. The manufacturing method according to claim 20, wherein the organic material layer comprises a planarization layer; or the organic material layer comprises a planarization layer and a pixel defining layer.

26. The manufacturing method according to claim 25, wherein the step of forming a functional film layer on the base substrate comprises forming a barrier layer, a buffer layer, a first conductive layer, a gate insulating layer, a second conductive layer, an interlayer dielectric layer, a third conductive layer and a passivation layer sequentially on the base substrate; and wherein the inorganic material layer comprises at least one of the barrier layer, the buffer layer, the gate insulating layer and the interlayer dielectric layer.

27. The manufacturing method according to claim 26, wherein, in the step of forming an organic material layer on a side of the functional film layer away from the base substrate, a surface of the planarization layer away from the base substrate comprises a first planarization layer surface portion and a second planarization layer surface portion, an orthographic projection of the first planarization layer surface portion on the base substrate at least partially overlaps an orthographic projection of the cutting area on the base substrate, and an orthographic projection of the second planarization layer surface portion on the base substrate at least partially overlaps an orthographic projection of the first barrier dam on the base substrate;

wherein a vertical distance d1 between the first planarization layer surface portion and a reference plane at a first position is less than a vertical distance d2 between the first planarization layer surface portion and the reference plane at a second position, and the vertical distance d2 is less than a vertical distance d3 between the second planarization layer surface portion and the reference plane; and wherein the reference plane is a surface of the interlayer dielectric layer away from the base substrate, an orthographic projection of the first position on the base substrate falls within an orthographic projection of the cutting area on the base substrate, an orthographic projection of the second position on the base substrate falls within an orthographic projection of an adjoining portion between the cutting area and the first barrier dam on the base substrate.

28. The manufacturing method according to claim 27, wherein, in the step of removing at least a portion of the inorganic material layer located in the cutting area, the portion of the inorganic material layer located in the cutting area is removed by an etching process.

* * * * *